(12) United States Patent
Gruner et al.

(10) Patent No.: US 7,408,616 B2
(45) Date of Patent: Aug. 5, 2008

(54) MICROLITHOGRAPHIC EXPOSURE METHOD AS WELL AS A PROJECTION EXPOSURE SYSTEM FOR CARRYING OUT THE METHOD

(75) Inventors: Toralf Gruner, Aalen-Hofen (DE); Daniel Kraehmer, Aalen (DE); Michael Totzeck, Schwaebisch-Gmuend (DE); Johannes Wangler, Koenigsbronn (DE); Markus Brotsack, Aalen (DE); Nils Dieckmann, Huettingen (DE); Aksel Goehnermeier, Aalen (DE); Markus Schwab, Herzogenaurach (DE); Damian Fiolka, Oberkochen (DE); Markus Zenzinger, Ulm (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/949,396

(22) Filed: Sep. 27, 2004

(65) Prior Publication Data

US 2005/0146704 A1 Jul. 7, 2005

Related U.S. Application Data

(63) Continuation-in-part of application No. PCT/EP03/11977, filed on Oct. 29, 2003.

(30) Foreign Application Priority Data

Sep. 26, 2003 (DE) .............................. 103 46 203

(51) Int. Cl.
G03B 27/42 (2006.01)
(52) U.S. Cl. .............................. 355/53; 355/67; 355/69
(58) Field of Classification Search .................. 355/53, 355/71, 67; 359/437
See application file for complete search history.

(56) References Cited

U.S. PATENT DOCUMENTS

| | | | |
|---|---|---|---|
| 3,600,611 A | 8/1971 | Treharne | |
| 5,300,972 A * | 4/1994 | Kamon | 355/71 |
| 5,442,184 A | 8/1995 | Palmer et al. | |
| 5,465,220 A | 11/1995 | Haruki et al. | |
| 5,537,260 A | 7/1996 | Williamson | |
| 5,572,287 A | 11/1996 | Wangler et al. | |
| 5,646,715 A | 7/1997 | Wangler | |
| 5,673,103 A | 9/1997 | Inoue et al. | |
| 5,677,755 A | 10/1997 | Oshida et al. | |
| 5,715,084 A | 2/1998 | Takahashi et al. | |
| 5,815,247 A | 9/1998 | Poschenrieder et al. | |
| 5,922,513 A | 7/1999 | Jeon et al. | |
| 5,933,219 A | 8/1999 | Unno | |
| 5,966,202 A | 10/1999 | McCullough | |
| 6,013,401 A | 1/2000 | McCullough et al. | |
| 6,084,708 A | 7/2000 | Schuster | |
| 6,097,474 A | 8/2000 | McCullough et al. | |
| 6,141,148 A | 10/2000 | Becker | |
| 6,163,367 A | 12/2000 | Obszarny | |
| 6,191,880 B1 | 2/2001 | Schuster | |
| 6,252,712 B1 | 6/2001 | Furter et al. | |
| 6,285,443 B1 | 9/2001 | Wangler et al. | |
| 6,324,003 B1 | 11/2001 | Martin | |
| 6,333,780 B1 | 12/2001 | Tsukuda | |
| 6,392,800 B2 | 5/2002 | Schuster | |
| 6,466,303 B1 | 10/2002 | Omura et al. | |
| 6,483,573 B1 * | 11/2002 | Schuster | 355/71 |
| 6,552,836 B2 * | 4/2003 | Miller | 359/237 |
| 6,636,295 B2 | 10/2003 | Shiozawa | |
| 6,661,499 B2 | 12/2003 | Omura et al. | |
| 6,673,103 B1 | 1/2004 | Golds et al. | |
| 7,015,456 B2 * | 3/2006 | Takeuchi et al. | 250/225 |
| 2001/0012154 A1 | 8/2001 | Schuster | |
| 2002/0126380 A1 | 9/2002 | Schuster | |
| 2002/0149757 A1 | 10/2002 | Kelsey et al. | |
| 2002/0176166 A1 * | 11/2002 | Schuster | 359/494 |
| 2003/0011759 A1 | 1/2003 | Omura et al. | |
| 2003/0174400 A1 * | 9/2003 | Patel et al. | 359/498 |
| 2004/0033426 A1 * | 2/2004 | Den Boef et al. | 430/22 |
| 2004/0057036 A1 | 3/2004 | Kawashima et al. | |
| 2006/0055834 A1 | 3/2006 | Tanitsu et al. | |

FOREIGN PATENT DOCUMENTS

| | | |
|---|---|---|
| EP | 0 602 923 A1 | 6/1994 |
| EP | 0 608 572 A2 | 8/1994 |

(Continued)

OTHER PUBLICATIONS

Koichi Matsumoto and Tadao Tsuruta, Issues and method of designing lenses for optical lithography, Optical Engineering, Dec. 1992, pp. 2657-2664, vol. 31, No. 12.

(Continued)

*Primary Examiner*—Della J. Rutledge
(74) *Attorney, Agent, or Firm*—Sughrue Mion, PLLC

(57) ABSTRACT

In an exposure method for exposing a substrate which is arranged in the area of an image plane of a projection objective as well as in a projection exposure system for performing that method, output radiation directed at the substrate and having an output polarization state is produced. Through variable adjustment of the output polarization state with the aid of at least one polarization manipulation device, the output polarization state can be formed to approach a nominal output polarization state. The polarization manipulation can be performed in a control loop on the basis of polarization-optical measuring data.

44 Claims, 9 Drawing Sheets

FOREIGN PATENT DOCUMENTS

| | | |
|---|---|---|
| EP | 0 747 772 A1 | 12/1996 |
| EP | 0 764 858 A2 | 3/1997 |
| EP | 0 937 999 A1 | 8/1999 |
| EP | 0 942 300 A2 | 9/1999 |
| EP | 0 964 282 A2 | 12/1999 |
| EP | 1 020 769 A2 | 7/2000 |
| GB | 1 098 897 | 1/1968 |
| JP | 06020912 | 1/1994 |
| WO | WO 01/50161 A1 | 7/2001 |

OTHER PUBLICATIONS

V. Bagini et al., The Simon-Mukunda polarization gadget, Eur. J. Phys., Apr. 1996, pp. 279-284, vol. 17.

Yasuyuki Unno, Polarization effect of illumination light. SPIE, Optical/Laser Microlithography VI, 1993, pp. 879-891, vol. 1927.

\* cited by examiner

MICROLITHOGRAPHIC EXPOSURE METHOD AS WELL AS A PROJECTION EXPOSURE SYSTEM FOR CARRYING OUT THE METHOD

This application is a continuation-in-part application of international patent application PCT/EP03/11977 filed on Oct. 29, 2003, which was published under PCT Article 21(2) in English, and the disclosure of which is incorporated herein by reference. Priority is claimed from German patent application DE 103 46 203.1 filed on Sep. 26, 2003.

BACKGROUND OF THE INVENTION

1. Field of the Invention

The invention relates to an exposure method for exposure of a substrate which is arranged in the area of an image plane of a projection objective by at least one image of a pattern of a mask which is arranged in the area of an object plane of the projection objective, and to a projection exposure system for carrying out this method.

2. Description of the Related Art

Microlithographic exposure methods and projection exposure systems are used for production of semiconductor components and other finely structured parts. They are used to project patterns of photomasks or graduated reticles, which are referred to in a general form in the following text as masks or reticles, onto a substrate which is coated with a radiation-sensitive layer, for example onto a semiconductor wafer which is coated with photoresist, with a very high resolution and on a reduced scale.

A projection exposure system for microlithography comprises an illumination system for illumination of the mask with illumination radiation, as well as a projection objective which follows the mask and which is used to image the pattern of the mask in the image plane of the projection objective. In this case, the radiation which has been changed by the mask passes through the projection objective, which produces output radiation that is directed at the substrate and whose characteristics determine the quality of the image production. In this case, the output polarization state, that is to say the polarization state of the output radiation which emerges from the projection objective and is directed at the substrate, plays an increasingly important role for decreasing wavelengths and increasing numerical apertures.

When using conventional lithography objectives, with image-side numerical apertures NA which are not excessively high, and which objectives have a purely refractive (dioptric) form and are normally operated using unpolarized light at wavelengths of 248 nm or above, the output polarization state is in most cases not critical. For systems which are operated with polarized light, for example catadioptric projection objectives with a polarization-selective, physical beam splitter (beam splitter cube, BSC), the output polarization state is, in contrast, a critical parameter.

Birefringence effects of synthetic quartz glass are significant even at operating wavelengths of about 193 nm. When using fluoride crystal materials, such as calcium fluoride, which are used, for example, in order to avoid compacting and/or for correction of color errors, it should be borne in mind that these materials are polarization-optically effective. Owing to stress-induced and/or intrinsic birefringence, they can cause polarization-changing effects on the light passing through them.

At the moment, only calcium fluoride is available in the required quality and quantity as a lens material for operating wavelengths of about 157 nm or below. At these short operating wavelengths, the influence of intrinsic birefringence is several times stronger than at a wavelength of 193 nm. Stress birefringence is likewise frequently observed to a disturbing extent.

It should also be borne in mind that deflection mirrors are used for many optical systems used in projection exposure systems, can be operated with an oblique radiation incidence and can accordingly produce a polarizing effect. For example, one or more deflection mirrors can be provided in the exposure beam path, that is to say between the light source and the outlet of the exposure system, in order to reduce the physical length of the exposure unit. Owing to the different reflection levels for s-polarized and p-polarized field components of the radiation coming from the light source, it is possible, for example, for partially polarized illumination radiation to be produced from initially unpolarized radiation. If linear-polarized laser light is used, then the direction of the linear polarization can be changed, or an elliptical polarization state can be produced by using an appropriate phase effect. In the case of catadioptric systems, obliquely illuminated deflection mirrors are likewise frequently provided in the area of the projection objectives, which may have a polarization-changing effect, and accordingly influence the output polarization state.

For high numerical apertures, for example with values of NA=0.85 or more, the vector character of the image-producing electric field also makes itself increasingly noticeable. For example, the s-polarized components of the electric field, that is to say that component which oscillates at right angles to the incidence plane spanned by the incidence direction and the normal to the surface of the substrate interferes better and produces better contrast than the p-polarized component which oscillates at right angles to it. In contrast, p-polarized light is generally coupled better into the photoresist. Proposals have therefore already been made to operate with specifically polarized output radiation, for example with tangential polarization or radial polarization, depending on the use of high apertures. Sometimes, even circular-polarized or unpolarized output radiation is also desirable.

Unfavorable polarization states can lead to a variation in the width of imaged structures over their direction. Such interference with a desired direction independence of the image is frequently referred to as HV differences or critical dimension variation (CD variation). Variations of the imaged structure widths across the field are also observed. Furthermore, undesirable nonlinear relationships may occur between the size of the structure to be imaged and the size of the imaged structure. In addition, unfavorable polarization states can induce telecentricity errors, which can lead to undesirable distortion between different adjustment planes. Not least, in systems which operate with polarization, radiation of the parasitic polarization which, for example, can occur due to leakage transmission on polarizing elements, may have a contrast-reducing effect.

European Patent Application EP 0 937 999 A1 discloses a microlithographic projection objective, which contains one or more optical elements which cause disturbance of the polarization distribution across the cross section of a light beam. This disturbance of the polarization distribution is at least partially compensated for by means of a polarization compensator, which comprises at least one birefringent optical element with a thickness which varies irregularly over its cross section. The polarization compensator has a fixed predetermined spatially varying effect function, is manufactured individually in the form of "polarization goggles" on the basis of polarization-optical measurement data which is recorded on the completely assembled and adjusted system, and is permanently mounted in the system by the manufacturer.

EP 964 282 A2 deals with the problem of a preferred polarization direction being introduced when light passes through catadioptric projection systems with deflection mirrors, resulting in the deflection mirrors, which have two or more coatings, having different deflection levels for s-polarized and p-polarized light. In consequence, light which is still unpolarized in the reticle plane is partially polarized in the image plane, which is said to lead to direction dependency of the imaging characteristics. This effect is counteracted by producing partially polarized light in the illumination system with a predetermined residual polarization degree in order to create a polarization advance, which is compensated for by the projection optics such that unpolarized light emerges at its output.

EP 0 602 923 B1 (corresponding to U.S. Pat. No. 5,715, 084) discloses a catadioptric projection objective which is operated with linear-polarized light and has a polarization beam splitter, in which a device for changing the polarization state of the light passing through is provided between the beam splitter cube and the image plane, in order to convert the incident, linear-polarized light to circular-polarized light (as an equivalent to unpolarized light). This is intended to ensure imaging contrast that is independent of the structure direction. A corresponding proposal is also made in EP 0 608 572 (corresponding to U.S. Pat. No. 5,537,260).

The patent U.S. Pat. No. 5,673,103 discloses a projection illumination method for reticle structures with at least two different structure directions, which are intended to be imaged with a preferred polarization direction using polarized light. A rotatable polarization control device is used to align the preferred polarization direction of the illumination radiation for each structure direction, by rotation optimally with respect to the structure direction.

The patent U.S. Pat. No. 5,922,513 describes a projection exposure method which operates with elliptically polarized light. On the basis of theoretical considerations, this document proposes that the ellipticity degree and the ellipticity angle be set as a function of the reticle structures so as to produce optimum contrast.

SUMMARY OF THE INVENTION

It is one object of the invention to provide a microlithographic exposure method and a projection exposure system which is suitable for carrying out the method and which also allows good imaging performance at short operating wavelengths of about 193 nm or less. It is another object to minimize polarization-dependent imaging errors over the entire lifetime of the projection exposure system. A further object is to simplify the adjustment of projection exposure systems.

As a solution to these and other objects the invention, according to one formulation, provides an exposure method for exposing a substrate which is arranged in the area of an image plane of a projection objective by at least one image of a pattern of a mask which is arranged in the area of an object plane of the projection objective, comprising:

illuminating the pattern with illumination radiation from an illumination system for production of radiation which is changed by the pattern;

passing the radiation which has been changed by the pattern through the projection objective in order to produce output radiation directed at the substrate and having an output polarization state;

variably adjusting the output polarization state with the aid of at least one polarization manipulation device in order to make the output polarization state approach a nominal output polarization state which is intended for the exposure.

Advantageous developments are specified in the dependent claims. The wording of all the claims is included in the content of the description by reference.

In an exposure method according to the invention of the type mentioned initially, the pattern of the mask is illuminated with illumination radiation from an illumination system, thus resulting in radiation being produced which has been changed by the pattern. This radiation passes through the projection objective and produces output radiation which is directed at the substrate and has an output polarization state. The variable adjustment of the output polarization state with the aid of at least one polarization manipulation device results in the actual output polarization state being matched to a nominal output polarization state, which is intended for the corresponding exposure, to such an extent that it is possible to comply with the tolerances, as specified for the exposure process, for polarization-sensitive imaging errors.

The invention makes it possible to effectively correct polarization aberrations, that is to say effects which are related to the vector character of the electric field. One major advantage of the invention is that variable adjustment of the output polarization state also makes it possible to control and minimize those imaging errors which can occur only during operation of a projection exposure system, for example in situ at the premises of the manufacturer of semiconductor components or other microstructured devices. This is because it is necessary to take account of the fact that the residual absorption of the optical elements of a lithography objective can lead to heating, which can itself lead to mechanical stresses which in turn can lead to the creation or variation of the birefringent effect in correspondingly susceptible materials. In this case, the spatial patterns of the heating are generally application-specific and can therefore not be taken into account for all time by an optimized design of a projection exposure system. Further changes in the polarization effect during the life of a projection exposure system can be caused by radiation-induced and contamination-induced layer degradation, relaxation of stresses or else by position changes of elements that produce a polarization effect, for example by shifting and tilting. Since it is possible in the case of projection exposure systems according to the invention to set the output polarization state variably by means of suitable polarization manipulation, it is possible to react at short notice to such polarization changes, in order to keep the imaging performance within predetermined specifications overall.

In particular, it is thus possible for the illumination system and/or the projection objective to contain at least one optical element which causes disturbance of the polarization distribution over the cross section of a beam, and for the output polarization state to be adjusted so as to at least partially compensate for this disturbance or interference. One or more polarization manipulation devices which are used for this purpose can accordingly be configured, or can be adaptively configured, as a compensator or compensators for partial or complete compensation of such disturbances.

The adjustment of the output polarization state according to the invention is accordingly carried out in preferred variants during the operation of the projection illumination system, in particular at its point of use.

An adjustment process can be carried out away from the point of use, for example at the manufacturer's premises, for example for adjustment work before initial use and/or during maintenance work. Considerable time and cost advantages for adjustment and maintenance can be achieved with the aid of the invention.

For the purposes of this application, a "polarization manipulation device" is a device with one or more components which have a polarization-optical effect, can change the polarization state of the incident radiation in a manner which can be predetermined in a defined manner, and which is alternatively also referred to in the following text as "polarization elements". These may be integral or formed from two or more parts. In this case, a polarization manipulation device is alternatively also referred to as a polarization manipulator and has at least two different configurations, which correspond to different polarization-optical effect functions.

The possible polarization state changes include in particular deliberate position-dependent modification of the polarization state over the cross section of a radiation beam. Polarization elements with an effect which depends on the position are also referred to in the following text as being "position-variant" or "space-variant".

Furthermore, polarization elements are possible with an effect which depends on the incidence angle of the radiation. These are also referred to in the following text as "angle-variant". Components or polarization elements with a polarization-optical effect may also have an effect which is dependent both on the incidence angle and on the position, in which case one of the dependences is generally dominant. Angle-dependent polarization effects occur, for example, with intrinsic birefringence and layer transmission or reflection in isotropic layers. For a position-dependent effect, elements which are structured laterally, that is to say over their cross section, can be used for example and this can be done, for example, on a diffractive or crystal-optic basis. A position-dependent effect can likewise be achieved by transmission or reflection on anisotropic layers. Finally, a position-variant effect can also be achieved by means of a position distribution, which is set deliberately and may possibly be variable, of mechanical stresses in a material which has a stress-optical effect.

The polarization-optical effect of two cited types of polarization elements depends on the installation position in the respective optical system. When positioned in the vicinity of or on a pupil plane, a position-variant element acts on the pupil, and an angle-variant element acts on the field. When positioned close to the field, that is to say on a field plane or in its vicinity, this is precisely reversed. In this case, a position-variant element acts on the field, and an angle-variant element acts on the pupil. The polarization states over the field and over the pupil can accordingly be influenced at least approximately separately by choice of the installation position and, possibly, of suitable combinations.

In one development, the adjustment of the output polarization state comprises the insertion, which can be carried out as required, of at least one component which has a polarization-optical effect, with a predetermined position-variant and/or angle-variant effect function at a predetermined installation position in the beam path between a light source, which is associated with the illumination system, and the image plane of the projection objective. The output polarization state can accordingly be varied by insertion of a polarization element such as this in the beam path, or by removing it from the beam path.

It may be particularly advantageous for a first component with a polarization-optical effect and having a first effect function to be exchanged for at least one second component, with a polarization-optical effect and having a second effect function that is not the same as the first, so that, possibly in combination with removal of polarization elements at the point of installation, it is possible to select or switch between two, three or more different options for influencing the polarization state.

Alternatively or additionally, it is possible to achieve the adjustment of the output polarization state by means of step-by-step or continuous variation of the effect function of at least one adjustable component with a polarization-optical effect. This can be permanently installed in the system, but it is likewise possible to exchange it for adjustable polarization elements.

If a polarization manipulation device is provided in the illumination system, then the polarization state of the illumination radiation which falls on the mask can be adjusted deliberately in order to provide, for example, virtually or completely unpolarized or circular-polarized light, or largely linear-polarized light in the mask plane. In an embodiment the output of the illumination system is optimized such that a variation of the polarization state across the illuminated field on the reticle is minimized. Particularly the linear degree of polarization is kept virtually constant or at least with a minimum variation across the field plane In a scanner system, the scan-integrated linear degree of polarization along the cross scan direction (direction perpendicular to the scanning direction) may be made virtually constant. Improved contrast can be obtained this way.

Any manipulation of the illumination radiation can also affect the output polarization state, and can be optimized in a corresponding manner.

The imaging can be influenced by using one or more polarization manipulation devices between the object plane and the image plane of the projection objective. In this case, a polarization manipulation device may possibly be arranged outside the projection objective, that is to say between the object plane and the objective inlet, or between the objective outlet and the image plane. This has the advantage that it makes it possible to avoid critical intervention in the projection objective. In many embodiments, at least one polarization manipulation device is provided on or in the projection objective.

The polarization manipulation device may be an exchangeable device, by means of which suitable polarization elements may optionally be inserted into or removed from the illumination beam path or imaging beam path, or may possibly be exchanged for polarization elements with a different polarization-changing effect. Devices for step-by-step or continuous variation of the effect function of an adjustable polarization element that is located in the beam path, without exchanging it, are also possible. For example, position-resolving (spatially resolving) adjustment of locally different delay effects on a delay device can be used to vary the local distribution of the polarization-optical effect over the cross section of the polarization element by, for example, adjusting the stress state of a component composed of stress-birefringent material by means of suitable actuators on the basis of a position distribution which can be predetermined. The effect function of one or more polarization elements can also be varied by changing its or their position, for example by rotation, decentering or tilting of one or more birefringent elements.

In many cases, it has been found to be particularly effective for polarization manipulation to be carried out on the basis of measured polarization-optical parameters. Accordingly, in one development, the output polarization state is measured with the aid of at least one polarization measurement device, in order to produce at least one actual signal which represents the present actual output polarization state. The corrections that are required for optimization can be determined by comparison of the actual output polarization state with the desired nominal output polarization state. Depending on the actual signal, at least one adjustment signal is produced, which is then used for adjustment of the output polarization state by means of at least one polarization manipulation device, in order to make this approach the nominal output polarization state.

The actual signal can be produced, for example, by angle-resolved and/or position-resolved measurement of the polarization state in the area of a field plane, in particular in the area of the image plane of the projection objective. Position-resolved measurement of the polarization state present in the area of a pupil plane is also possible.

This makes it possible to provide a control loop for real-time control of the output polarization state. The optical and/or electronic components that are required to carry out polarization control may be part of a wafer stepper or of a wafer scanner, so that the polarization control can be used during operation of the projection illumination system. For example, measurements can be carried out, and the projection objective and/or the illumination system can be optimized by means of suitable polarization manipulation, during production pauses between individual illumination processes.

It is also possible to produce one or more adjustment signals for a polarization manipulation device on the basis of a preset function provided in advance, for example a setting table or the like. This allows forward correction of the projection illumination system in order, for example, to optimize the output polarization state for a specific type of exposure process on a process-specific basis. The data for the preset function can in theory be determined on the basis of model calculations, and/or empirically.

The above and further features are evident not only from the claims but also from the description and from the drawings, wherein the individual features are in each case implemented in their own right or in combinations of two or more in the form of subcombinations for an embodiment of the invention and in other fields, and may represent advantageous embodiments as well as embodiments that are patentable in their own right.

DETAILED DESCRIPTION OF PREFERRED EMBODIMENTS

Figure 1:
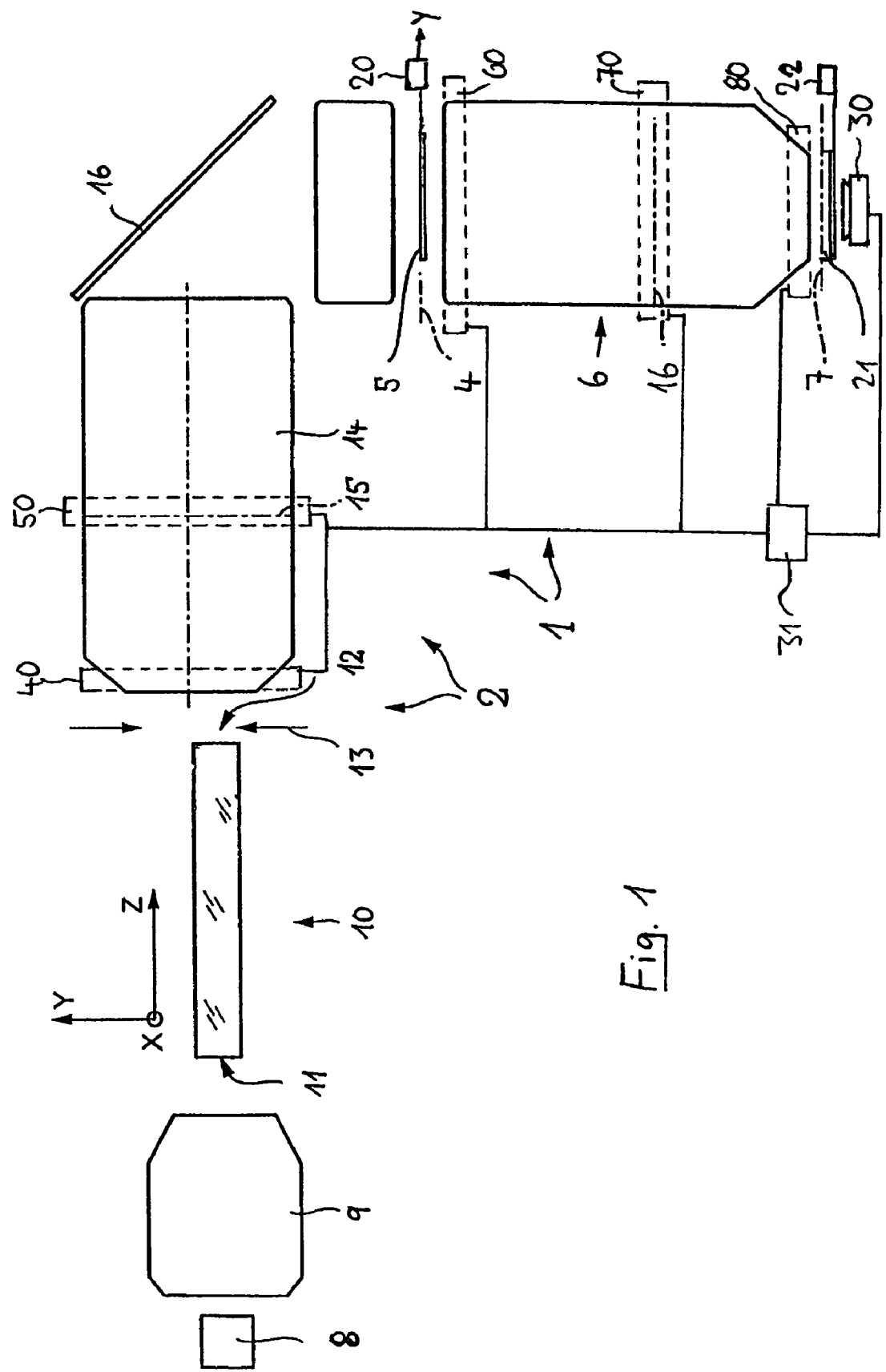
FIG. 1 shows a schematic illustration of one embodiment of a projection exposure system according to the invention.

FIG. 1 shows an example of a projection exposure system 1 for microlithographic production of integrated circuits and other finely structured components with resolutions down to fractions of 1 μm. The installation 1 comprises an illumination system 2 for illumination of a photomask 5 which is arranged in the outlet or image plane 4 of the illumination system, as well as a projection objective 6 which images the pattern of the photomask that is arranged in its object plane 4 onto the image plane 7 of the projection objective on a smaller scale. A semiconductor wafer which is coated with a light-sensitive layer is located, for example, on the image plane 7.

A laser 8 is used as the light source for the illumination system 2, for example an excimer laser used in the deep ultraviolet band (DUV) and with an operating wavelength of 248 nm, 193 nm or 157 nm. The light in the light beam that is emitted is largely linear-polarized. A downstream optical device 9 forms the light of the light source and transmits it to a downstream light mixing device 10. In the illustrated example, the optical device 9 comprises a beam expander, which is arranged downstream of the laser 8 and is used for coherence reduction and for beam forming to a rectangular beam cross section with an aspect ratio x/y of its side lengths of more than unity. A first diffractive optical raster element which is downstream from the beam expander is located on the object plane of a downstream zoom axicon objective, on whose pupil plane a second optical raster element is provided. These devices allow the illumination system to be switched between different illumination modes, for example between conventional illumination with a variable coherence degree, annular field illumination and dipole or quadrupole illumination. The light then enters input optics, which transmit the light to the inlet surface 11 of the light mixing device. The light is mixed and homogenized by means of multiple internal reflection within the light mixing device 10, and emerges at the outlet 12 of the light mixing device, largely homogenized. Immediately adjacent to the outlet of the light mixing device there is an intermediate field plane, in which a reticle masking system (REMA) 13, an adjustable field aperture, is arranged. The downstream objective 14, which is also referred to as an REMA objective, has two or more lens groups, a pupil plane 15 and a deflection mirror 16, and images the intermediate field plane of the reticle masking system onto the reticle or photomask 5.

Further details relating to the structure and method of operation of an illumination system such as this can be found, for example, in EP-0 747 772 A1, whose contents are included by reference in the contents of this application. Embodiments without a light mixing device are also possible.

In the case of a wafer stepper, the entire structured surface which corresponds to a chip, in general a rectangle with any desired aspect ratio between the height and width of, for example 1:1 to 1:2, is thus illuminated as uniformly as possible and with the edges being as sharp as possible on the reticle 5. In the case of a wafer scanner of the described type, a narrow strip, for example a rectangle with an aspect ratio of typically 1:2 to 1:8, is illuminated on the reticle 5, and the entire structured field of a chip is illuminated in a serial form by scanning in a direction which corresponds to the y direction of the illumination system. In this case as well, the illumination is designed to be extremely uniform and to provide sharp edges at least in the direction at right angles to the scanning direction, that is to say in the x direction.

In exceptional cases, other forms of the illuminated surface on the photomask 5 are also possible. The opening of the reticle masking system 13 and the cross-sectional shape of the light outlet 12 of the light mixing device 10 are matched precisely to the required field form. In the example, the width in the x direction is two or more times the overall height in the y direction (scanning direction).

A device 20 for holding and manipulating the mask 5 is arranged behind the illumination system, such that the mask is located in the object plane 4 of the projection objective and can be moved by means of a scanning drive in this plane for scanner operation in a departure direction (y direction).

The projection objective 6 follows behind the mask plane 4, acts as a reduction objective and images an image of a pattern, which is arranged on the mask, on a reduced scale, for example on a scale of 1:4 or 1:5, on a wafer 21 which is covered with a photoresist layer and is arranged on the image plane 7 of the reduction objective. Other reduction scales, for example greater reductions up to 1:20 or 1:200, are possible. The wafer 21 is held by a device 22 which comprises a scanner drive, in order to move the wafer in synchronism with the reticle 5, and parallel to it.

A polarization measurement device 30 is arranged in the beam direction behind the wafer plane 7, and allows the output polarization state of the projection exposure system, that is to say the polarization state of the output radiation which is directed at the wafer, to be measured. In the exemplary system, a position-resolved and angle-resolved measurement of the field in the wafer plane 7 is possible, while other embodiments are designed for a position-resolved measurement of the outlet pupil 16 of the projection objective 6, which corresponds to angular resolution at the outlet of the projection objective. The measurement signals from the polarization measurement device are processed by a control device 31 which is connected to it and uses the polarization measured values to produce control signals for one or more polarization manipulation devices 40, 50, 60, 70, 80, which are arranged at selected installation positions in the beam path of the projection illumination system.

In the illustrated embodiment, a polarization manipulation device 40 is provided at an installation position close to the field in the vicinity of the intermediate field plane at the outlet of the rod integrator at the inlet of the objective 14, and a polarization manipulation device 50 is provided in the area of the pupil plane 15 of the objective 14, in order to allow adjustment of the polarization state of the illumination radiation which is incident on the reticle plane 4. A polarization manipulation device 60 close to the field and at the inlet of the objective, a polarization manipulation device 70 close to the pupil and in the area of the pupil 16 of the projection objective close to the image field, and a further polarization manipulation device 80 close to the field and in the immediate vicinity of the image plane, that is to say close to the field, are provided for the projection objective 6. In most embodiments, only some of such polarization manipulation devices are provided, and can also be arranged at other installation positions in the illumination system or in the projection objective, or in the vicinity of the field planes that are located outside the optical systems, for example immediately in front of or behind the reticle plane 4, or directly on the wafer plane 7.

Figure 2:
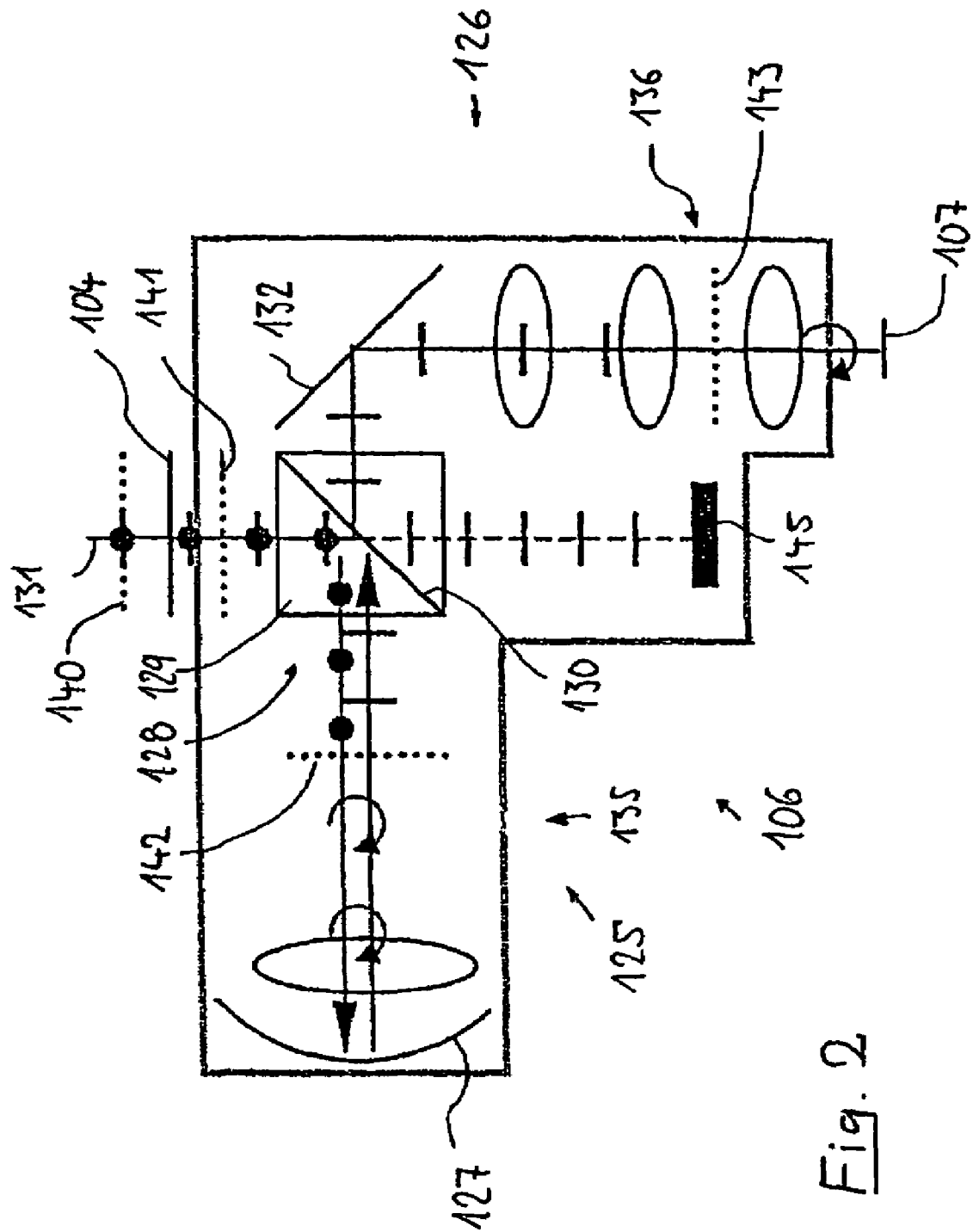
FIG. 2 shows a schematic illustration of a catadioptric projection objective according to one embodiment of the invention.

FIG. 2 shows one embodiment of a projection objective 106, which is in the form of a catadioptric projection objective with polarization-selective, physical beam splitting. This has a catadioptric objective part 125 between its object plane (mask plane 104) and its image plane (wafer plane 107), and a purely dioptric objective part 126 behind this. The catadioptric objective part comprises a concave mirror 127 and a beam deflection device 128, and produces a real intermediate image, which can be arranged in the area of the beam splitter (129), or away from it. The beam deflection device comprises a physical beam splitter 129 with a polarization-selective beam splitter layer 130, which is tilted with respect to that part of the optical axis 131 which is at right angles to the object plane. The beam deflection device also comprises a deflection mirror 132 which is arranged in the light path immediately behind the beam splitter and, in conjunction with the reflection on the beam splitter layer, allows the object plane and the image plane to be arranged parallel, thus simplifying scanner operation. Since one, and only one, real intermediate image is produced, two mutually optically conjugated pupil planes are located between the object plane and the image plane, that is to say a pupil plane 135 in the vicinity of the concave mirror and a pupil plane 136 close to the image and in the dioptric objective part. The pupil planes are generally not exactly flat, so that they can also be referred to as pupil surfaces.

In the example, the illumination system is designed to emit linear-polarized illumination light. In order to simplify structure-direction independent imaging, the reticle should, however, be illuminated with circular-polarized light. In order to achieve this, a device which is, for example, in the form for a λ/4 plate 140 is arranged between the outlet of the illumination system and the reticle plane, in order to convert linear-polarized light to circular-polarized light. The projection objective itself is designed for operation with circular-polarized light and has a device which, for example, is in the form of a λ/4 plate 141 between the object plane and the beam splitter, for conversion of circular-polarized light to light which is s-polarized with respect to the beam splitter layer 130 and is accordingly reflected well. A polarization rotation device 142 is arranged between the beam splitter layer 130 and the concave mirror 127, acts as a λ/4 plate and accordingly results in the preferred polarization direction being rotated through 90° as the light passes through it twice, so that the light which arrives at the beam splitter layer on the return path from the concave mirror is p-polarized with respect to this, and is accordingly transmitted. In the refractive objective part, a further delay device 143 which acts as a λ/4 plate is provided in the vicinity of the pupil plane 136 between the deflection mirror 132 and the image plane, and converts the incident linear-polarized light to circular-polarized light as the equivalent of unpolarized light.

If any leakage transmission of residual components of p-polarized light occurs at the beam splitter layer, this light is trapped in a light trap 145.

Intensity inhomogeneities in the field can be corrected in this embodiment by the delay effect of the delay devices 140, 141 which are arranged close to the field being set on a position-resolving basis such that the delay effect differs locally from the nominal value λ/4. The light behind the delay device 141 is elliptically polarized at these spatially confined locations, so that the light is not all reflected on the beam splitter layer 130, and part of it is passed through to the light trap 145. The discrepancy from the nominal λ/4 value should be chosen such that the interference to be corrected is largely compensated for.

Intensity inhomogeneities in the pupil can be corrected in an analogous manner by the delay effect of the delay device 142 differing locally from the nominal λ/4 value. At these points, the light in the light path behind the delay device 142 is not purely p-polarized, but is elliptically polarized, so that the light is not all transmitted to the beam splitter layer, and part of it is reflected. The discrepancies from the nominal λ/4 value must once again be chosen such that the interference to be corrected is largely compensated for.

Each of the delay devices 140, 141, 142, 143 can thus be used as an adjustable polarization manipulator, by means of which the wafer-side output polarization state can be adjusted in a variable manner. One possible design configuration will be explained with reference to FIG. 3.

Figure 3:
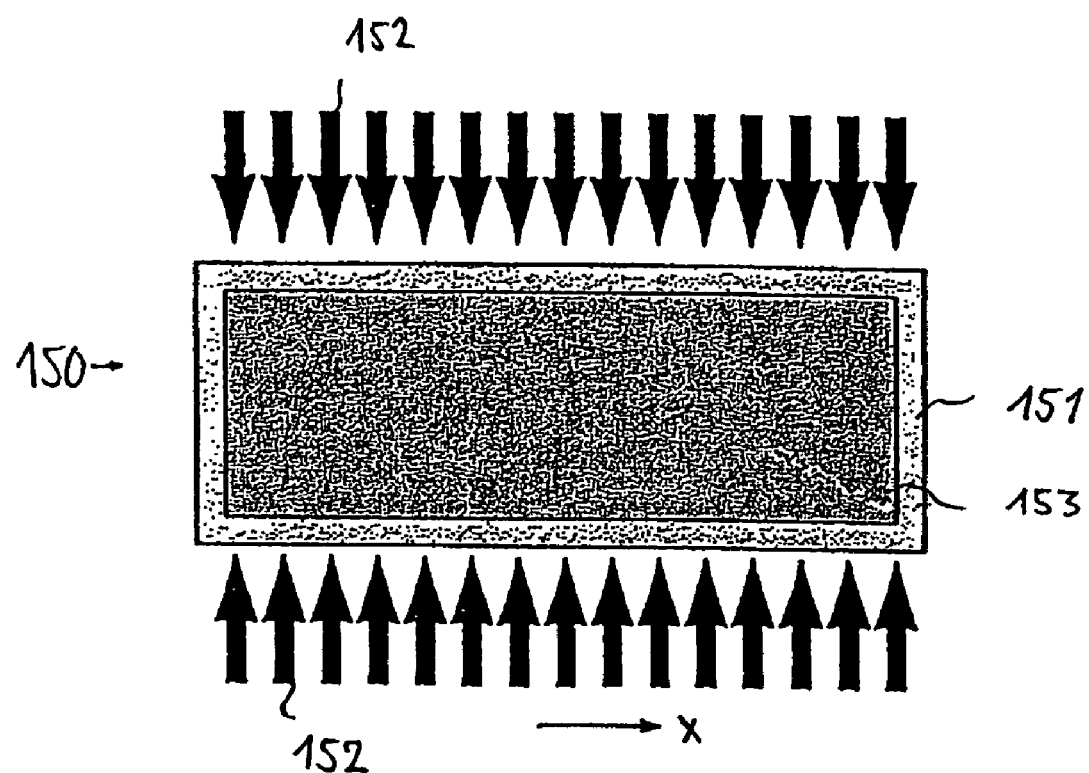
FIG. 3 shows a schematic illustration of one embodiment of a polarization manipulation device with a delay plate, whose delay effect can be adjusted variably on a position-resolving basis.

FIG. 3 will be used for reference to describe one embodiment of a polarization manipulation device 150 which allows position-resolving adjustment of locally different delay effects on a delay device, and which can be adjusted in a variable manner such that position-resolving variation of the effect function of the polarization element is possible by variation of a local or a spatial distribution of the polarization-optical delay effect over the cross section of the polarization element. The polarization manipulation device 150 comprises a plane-parallel plate 151 composed of calcium fluoride, whose crystallographic <100> axis is aligned at right angles to the plane of the plate and, in the installed state, is intended to be located essentially parallel to the optical axis. Rows of actuators 152 which can be electrically actuated individually are in each case fitted on the mutually opposite longitudinal sides on the circumference of the rectangular plate and may, for example, be in the form of calibrated piezoelectric elements, motor-driven micrometer screws or stepped-down stepper motors. Owing to the stress-birefringent characteristics of the fluoride crystal material, a mechanical prestress can be produced on the plate 151 such that the calcium fluoride plate of suitable thickness has the effect of a λ/4 plate homogeneously over the entire cross section. Details relating to the design of delay elements with a predetermined homogeneous delay effect composed of stressed calcium fluoride can be found, for example, in the patent U.S. Pat. No. 6,324,003 B1. Embodiments with stress-birefringent planar plates composed of quartz glass are disclosed, for example, in the patent U.S. Pat. No. 6,141,148 (corresponding to EP 0 942 300) from the applicant. The disclosure content of these documents is included by reference in the context of this description.

In contrast to conventional devices, it is possible in the case of polarization manipulation devices according to the invention to produce locally different delay effects in accordance with a delay profile that can be predetermined by deliberate actuation of the pressure-producing actuators 152 on the delay plate 151, in order to allow position-resolving correction which can be matched individually to the instantaneous system state. Time-variable correction functions can also be set via the actuators which can be driven, in order to make it possible to carry out continuous variations between different spatial distributions of the delay effect. In this case, the position resolution can be adjusted via the number of actuators 152, the geometry of the field 153 and the distance between a corresponding polarization manipulation device and an adjacent field plane, and is dependent on the material characteristics of the plate material.

Figure 4:
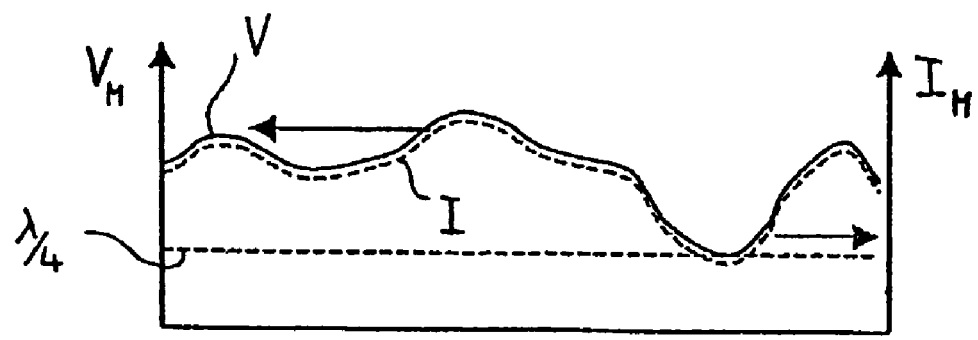
FIG. 4 shows a schematic diagram to explain a delay which is non-uniform over the cross section of the delay element.

When using a wafer scanner of the described type, the primary factor is the delay averaged over the scanner slit. This is illustrated schematically in FIG. 4. In this case, the solid line indicates the field profile of the delay $V_M$ averaged in the scanning direction (y direction) as a function of the x position. This is set on a position-resolving basis by adjusting the stress forces on the plate that are produced by the actuators 152, such that an averaged intensity profile $I_M$ is simulated over the field (represented by the dashed line), and is corrected in a corresponding manner to that described above. This makes it possible to partially or virtually completely compensate for intensity inhomogeneities over the field. Corresponding position-resolving corrections in the pupil area are possible by means of suitable arrangement of such polarization manipulation devices in the vicinity of the pupil.

In the case of projection objectives of the described type, in which λ/4 plates or comparable delay devices are provided, this variant of polarization manipulation can be carried out without any additional optical parts, since the existing delay elements can be exchanged for polarization manipulation devices according to the invention. Extreme correction ranges are possible since, depending on the delay, the correction may assume any value between 0% and 100%, and the position function may have any desired, generally asymmetric, profiles.

Each of the delay devices 140, 141, 142, 143 may be designed in this or a similar manner as polarization manipulators, with one or two suitably positioned manipulators generally being sufficient. Polarization manipulators of the illustrated type may also be installed in catadioptric projection objectives with geometric beam splitting, in purely refractive projection objectives, or within an illumination system. Elements with different delay effects, for example λ/2 plates, may also be used in an analogous manner for position-resolving, variable setting of specific delay effects.

In order to have reliable control of the polarization state, provision is made in some embodiments for the elements which introduce the pressure to be calibrated, and/or for the pressure that they introduce and/or their position to be monitored. Alternatively or additionally, measurement processes for the selected polarization state may be provided for this purpose, allowing deliberate trimming of the delay elements. Particularly in the case of stressed rectangular plates, it may be worthwhile to design these to be rotatable, in order to provide a variable birefringence axis position for different applications.

As an alternative to rectangular plates, it is also possible to provide round stress-birefringent discs, on whose circumference two or more radially acting actuators are arranged, in order to deliberately produce specific radial or tangential birefringence profiles.

There are numerous further possible ways to provide polarization manipulators with a polarization-optical effect which can be adjusted deliberately and, if required, can be varied in the installed state. For example, a delay device (retarder) can be mounted rotatably, in particular in order to allow rotation about the optical axis. The rotation of a plane-parallel plate in this case does not produce any change in the scalar optical effect. Although its stress can lead to deformation of the wavefront, this can, however, be kept small provided that the plate thickness is sufficient, or its effect can be corrected by scalar means. In addition, axial shifting of an inhomogeneously stressed plane-parallel plate is evident only in the polarization state, but not in the scalar wavefront. Polarizing layers which can be influenced by stress or stressed lenses which can in theory be rotated without any scalar optical effect are also possible. Furthermore, rotation and/or axial shifting of wedges, at least one of which is composed of birefringent material, are/is also possible. For example, stressed calcium fluoride or, for example, magnesium fluoride can be used for this purpose which, if required, can be wrung onto a calcium fluoride substrate, or can be fixed in some other manner. Rotatable diffractive sub-wavelength gratings are also possible. The principle of operation of such elements will be explained in detail further below. Alternatively or additionally to rotation about the optical axis and decentering transversely with respect to this, it is also possible to tilt suitable polarization elements for polarization manipulation.

Adjustment of the output polarization state by variation of the polarization-optical characteristics of the projection illumination system can also be achieved by polarization elements with a fixed predetermined polarization-optical effect being inserted into or removed from the beam path as required, or to be exchanged for polarization elements with a different effect function, with the aid of suitable exchanging devices. This can preferably be done as a function of polarization-optical measurement data, in order for the output polarization state to be approximated to a desired required value.

Figure 5:
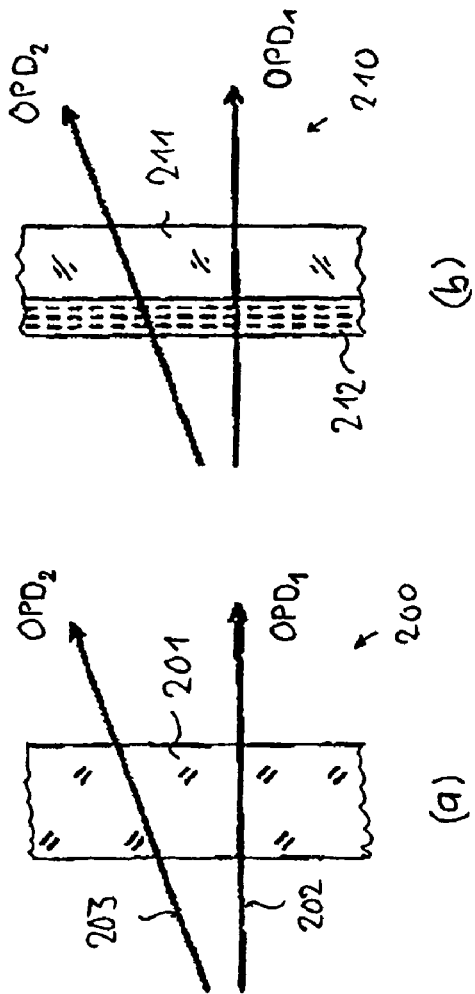
FIG. 5 shows various embodiments of angle-variant polarization elements.
Figure 6:
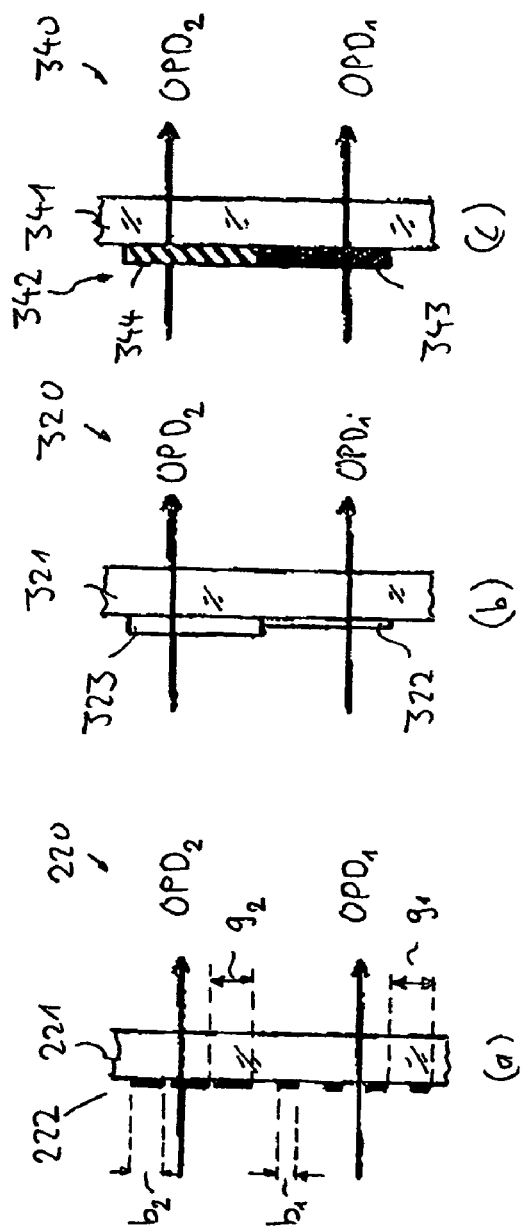
FIG. 6 shows various embodiments of predominantly position-variant polarization elements.

Examples of angle-variant polarization elements will be explained with reference to FIG. 5, while FIG. 6 shows examples of (predominantly) position-variant (space-variant) polarization elements. The planar plate 201 which is illustrated in FIG. 5(a) and is composed of stressed calcium fluoride forms an angle-variant polarization element 200 and has a delay effect that depends on the incidence angle. In this case, if the incident beams 202 are parallel to the optical axis, an optical path length difference $OPD_1$ is produced between the mutually perpendicular components of the electric field vector, depending on the extent of birefringence and on the thickness of the material through which the beam passes in the appropriate direction. In the case of beams 203 which run at an angle to the optical axis, the length of the optical material through which the beam passes is greater, and the extent of birefringence may also differ from that when the beam passes through it axially. Overall, this results in an optical path length difference $OPD_2$ for the field components, with $OPD_2$ not being the same as $OPD_1$. This results in a delay effect which depends on the incidence angle. The angle-variant polarization element 210 in FIG. 5(b) comprises a transparent substrate 211, onto whose inlet side a dielectric multilayer system 212 with an isotropic, birefringent effect is applied. Analogously to the birefringent plate, this results in delay effects which are dependent on the incidence angle, with different optical path length differences $OPD_1$ and $OPD_2$ within the layer system.

A layer system such as this may, in particular, be a multiple layer system with a large number of individual layers, with two or more or all of the individual layers having an optical layer thickness which is small in comparison to the operating wavelength of the illumination radiation. This results in the production of so-called form birefringence.

FIGS. 6(a) to (c) show examples of predominantly position-variant polarization elements, which may all have a symmetrical, for example radially symmetrical or rotationally symmetrical spatial effect function, or an asymmetric-spatial effect function. The polarization element 220 has a plane-parallel transparent plate 221, to whose inlet side a diffractive structure 222 is applied, in order to deliberately generate a position-dependent birefringence distribution. Structures such as these may produce structure-induced birefringence (structural birefringence), which is particularly pronounced when the periodicity lengths of the structures are small in comparison to the operating wavelength that it used (sub-wavelengths or sub-λ structures). In the case of sub-λ structures, no interfering higher diffraction orders are generated. In some circumstances, layers such as these may at the same time have an anti-reflection effect. In the exemplary system, linear gratings with different grating constants $g_1$ and $g_2$ and structure widths $b_1$ and $b_2$ are arranged alongside one another, producing optical path length differences $OPD_1$ and $OPD_2$ which are dependent on the incidence location.

Figure 7:
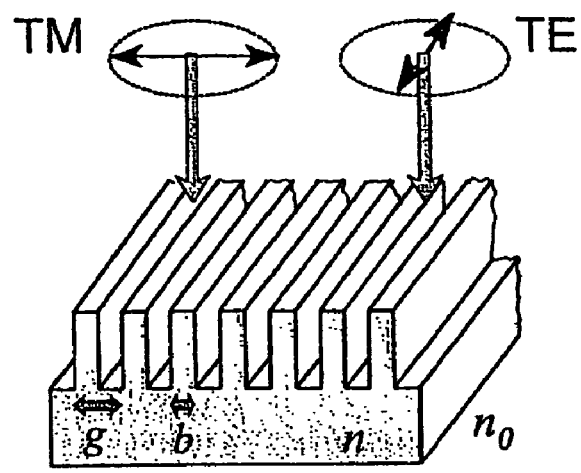
FIG. 7 shows a schematic illustration to explain the creation of structure-induced birefringence in sub-wavelength gratings.

The method of operation of sub-λ gratings will be explained in more detail in conjunction with FIG. 7, which illustrates, schematically, the eigen polarizations of a linear sub-λ grating. For small grating constants, the eigen polarizations E∥ and E⊥ respectively parallel to and at right angles to the grating grooves can be calculated in accordance with the effective medium model as follows:

$$E\|: n_{TM}^2 = Fn^2 + (1-F)n_0^2$$

$$E\perp: n_{TE}^2 = \frac{n^2 n_0^2}{Fn_0^2 + (1-F)n^2}$$

In this case, F is the filling factor, which is obtained from the grating constant g and the structure width b in accordance with $$F = \frac{b}{g}$$

n is the refractive index of the medium and $n_0$ is the refractive index of the environment. For example, if n=1.58 and $n_0$=1, optical path length differences and birefringences OPD=$n_{TM}$−$n_{TE}$ in the order of magnitude between 0 and about 0.13 can be achieved depending on the filling factor, with, for example, a grating depth of 10 nm/0.1272=78.6 nm being required for F=0.5 in order to achieve a birefringence of 10 nm. In addition to the linear birefringence distributions explained by way of example, radial or tangential birefringence distributions are also possible, by means of appropriate circular sub-λ gratings, or more general birefringence distributions, possibly asymmetric birefringence distributions, are possible by means of more general gratings.

Figure 8:
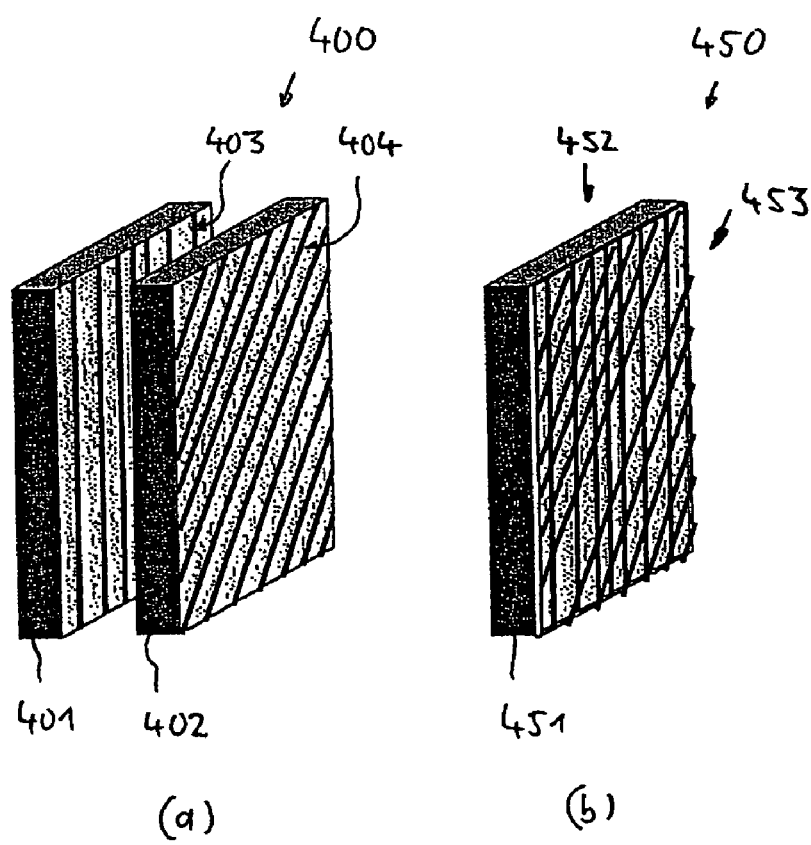
FIG. 8 shows embodiments of polarization elements with differently structured sub-wavelength gratings.

Since the optical path length differences which can be achieved are typically in the order of magnitude of a few nm, sub-λ structures are primarily suitable for compensation for small optical path length differences, over the cross section of a light beam. Otherwise, the required aspect ratio for the sub-grating to be provided would be rather large. This can be overcome, for example, by using a combination of two or more elements (arranged one behind the other). A combination with volume birefringence (stress birefringence and/or intrinsic birefringence) is also possible, in which case, for example, it is possible to use a diffractive structure for compensation for residual polarization errors of birefringent crystals. Larger grating periods have already been mentioned, but their effect can no longer be calculated on the basis of the effective medium theory. Finally, diffractive structures can be incorporated in a high refractive-index coating or in a high refractive-index substrate. This allows greater birefringences (optical path length differences) with a lower aspect ratio. Polarization elements with two or more sub-wavelength structures located one behind the other will be explained in more detail in conjunction with FIG. 8.

FIGS. 6(b) and (c) show other possibilities for predominantly position-variant polarization elements. In this case, the polarization element 320 in FIG. 6(b) has a plane-parallel transparent substrate 321, on whose inlet side delay platelets 322, 323 of different thickness and thus with different birefringence $OPD_1$ and $OPD_2$, respectively, are applied alongside one another. This allows any desired position distributions of a birefringence effect over the cross section of a polarization element (see FIG. 11). A corresponding effect can also be achieved by anisotropic coatings of the type illustrated in FIG. 6(c). For this purpose, an anisotropic coating 342 is applied to a transparent substrate 341 (which may have a plane-parallel form, or may be in the form of a wedge or lens) and has areas 343, 344, located alongside one another, of different birefringence $OPD_1$ and $OPD_2$, respectively, in order to achieve a desired position distribution of the birefringence effect.

The last described polarization elements have a fixed predetermined angle-variant and/or position-variant effect over their cross section. These can be used to set desired polarization states by inserting one or more such elements as required into the beam path of the optical system, or removing them from this beam path. For this purpose, polarization manipulators can be designed as exchanging devices, in the same way as the manipulations 40, 50, 60, 70, 80 shown in FIG. 1. In general, such exchangeable polarization elements can be incorporated at any point in the optical system. In particular, in this case, the pupil vicinity or the field vicinity may be chosen freely for design purposes. In this case, positions in the vicinity of the aperture (for example in the area of the pupil 16 in FIG. 1) are particularly useful. On the other hand, positions which are freely accessible from the outside are also of interest. This results in the least hardware complexity of the exchanging capability. In the case of purely refractive projection objectives, these are, for example, the ends of the objective, that is to say those elements which are located closest to the reticle or to the wafer (see the elements 60 and 80 in FIG. 1). The polarization element 80 in FIG. 1 could, for example, be an exchangeable closure plate which, as shown in FIG. 5 or 6, is in the form of a polarization element. The area of the concave mirror is added to this in a catadioptric system (see, for example, the polarization element 142 in FIG. 2). The final boundary surfaces, adjacent to the surroundings, of an optical system may, for example, be coated and/or provided with sub-λ structures.

With regard to the exchangeability, the mask and the wafer can also themselves be used as positions for polarization elements. Polarization filters may, for example, be fitted on a so-called "hard pellicle" close to the reticle. It is also possible to coat the mask (reticle) or to cover it with a raster composed of microstructured or oriented facets, such that advantageous polarization is achieved, matched to the respective reticle structures. By way of example, a polarization filter of the type illustrated in FIG. 5(b) or 6(c) can be provided on a wafer by appropriate coating over the light-sensitive layer (top-anti-reflective coating). In general, polarization elements on the reticle or on the wafer have the advantage that they have to satisfy less stringent life requirements than elements within the optical system.

In addition, the polarization-optical effect in the illumination system depends on the position of a polarization element. While, in principle, all the positions in the illumination optics are available for exchangeable polarization elements, the ends of this projection objective (for example the polarization manipulator 40 in FIG. 1) or of the input group 9 are suitable for such elements, in addition to the area of the pupil 15 of the imaging objective 14 (polarization manipulator 50 in FIG. 1). Furthermore, the reticle rear face is also available.

Diffractive elements with structure-induced birefringence can be used to generate numerous polarization transformations. The transformation of input radiation with any desired ellipticity to circular-polarized light is of particular technical importance in the field of lithography optics. This can be achieved by "diffractive pseudo-depolarizers". In this context, this means diffractive elements with a Jones matrix $\underline{J}$, which can convert polarized radiation with an ellipticity >0 to circular-polarized radiation, in accordance with:

$$\begin{pmatrix} J_{xx} & J_{xy} \\ J_{yx} & J_{yy} \end{pmatrix} \begin{pmatrix} a\exp(i\alpha) \\ 1 \end{pmatrix} = \begin{pmatrix} i \\ 1 \end{pmatrix}$$

For a linear birefringent structure at the angle φ, the Jones matrix becomes:

$$\begin{pmatrix} J_{xx} & J_{xy} \\ J_{yx} & J_{yy} \end{pmatrix} = \begin{pmatrix} \cos\varphi & \sin\varphi \\ -\sin\varphi & \cos\varphi \end{pmatrix} \begin{pmatrix} 1 & 0 \\ 0 & \exp(i\Delta\psi) \end{pmatrix} \begin{pmatrix} \cos\varphi & -\sin\varphi \\ \sin\varphi & \cos\varphi \end{pmatrix}$$

$$= \begin{pmatrix} \cos^2\varphi + \exp(i\Delta\psi)\sin^2\varphi & \cos\varphi\sin\varphi(1 - \exp(i\Delta\psi)) \\ \cos\varphi\sin\varphi(1 - \exp(i\Delta\psi)) & \sin^2\varphi + \exp(i\Delta\psi)\cos^2\varphi \end{pmatrix}$$

In order to find the suitable polarization element for a predetermined input polarization state, the Jones matrix shown above can be substituted into the equation mentioned above it, and the solution for the angle φ or ΔΨ can be found.

For linear-polarized input radiation, the solution is a suitably rotated λ/4 retarder. As the input radiation becomes more elliptical, the required delay becomes shorter, and the minima along the angle orientation become broader. In any case, the two variable parameters a and α, which describe the input polarization are opposite the two unknowns φ (angle orientation) and ΔΨ (delay) of the birefringent element.

More general polarization transformations are possible by means of polarization manipulation devices which comprise at least one delay group with a first delay device having a first delay effect, and at least one second delay device with a second delay effect, which is not the same as the first. As an example, FIG. 8(a) shows a polarization manipulator 400, which comprises two delay plates 401, 402 which are arranged one behind the other in the light propagation direction and to each of which differently dimensioned sub-wavelength structures 403, 404 of different orientation and/or structure parameters (grating constant, structure width) are applied. When using diffractive structures for producing delays, it is also possible as shown in FIG. 8(b) to provide polarization manipulators 450 in which two or more differently oriented and/or dimensioned diffractive structures 452, 453 are accommodated on a common substrate 451.

In the case of delay groups having at least two delay devices (retarders) with a different effect, use is made of the known breakdown of the Jones matrix into a product of "elementary matrices". It is thus possible to represent any desired Jones matrix as the product of two mutually rotated λ/4 retarders and a λ/2 retarder (see, for example, the article by V. Bagini R. Borghi, F. Gori, F. Frezza, G. Schettini, G. S: Spagnolo, "The Simon Mukunda polarization gadget", Eur. J. Phys. 17 (1996) pages 279-284). It is thus also possible within the scope of the invention to use as a polarization manipulation device a delay group in which a first delay device with the effect of a λ/4 delay, a second delay device with the effect of a λ/2 delay, and a third delay device with the effect of a λ/4 delay are provided in this sequence. In this case, the individual delay devices may be provided, as described, by sub-wavelength structures, coated substrates or else by other suitable retarders, for example by plates composed of birefringent material of suitable thickness.

A delay device may in this case have the same delay effect over the entire useful cross section. It is also possible to use delay devices which comprise a large number of individual delay elements over their cross section, and which are arranged in a raster arrangement, essentially filling the area. The individual delay elements may in this case differ in terms of the absolute magnitude ($\lambda/x$) of the delay effect and/or in terms of their axis orientation (orientation of the crystallographic major axis of a birefringent material). Various embodiments of polarization manipulation devices with delay groups of this type will be explained with reference to FIGS. 9 to 11.

Figure 9:
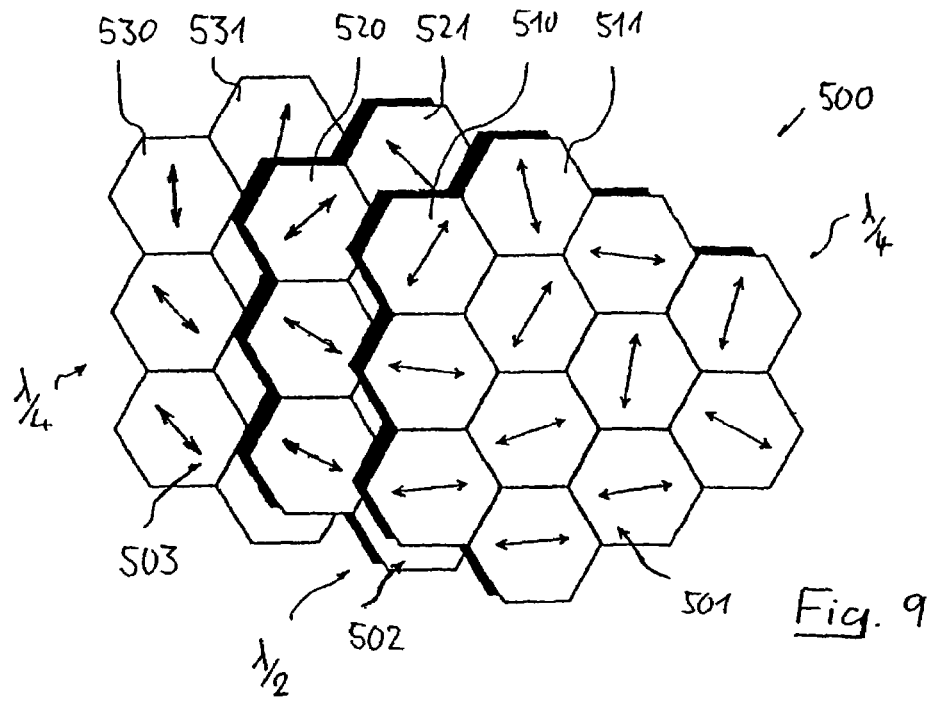
FIG. 9 shows a variant of a polarization element for position-resolving conversion of any desired polarization states to any other desired polarization states with series-connected $\lambda/4$ and $\lambda/2$ delay devices.

FIG. 9 shows, schematically, a polarization element 500, by means of which any desired polarization state of incident radiation can be converted to any other desired polarization state of the output radiation, on a position-resolved basis. The polarization element is a delay group with three delay devices 501, 502, 503 which are arranged one behind the other in the light propagation direction, are each in the form of plates, and comprise a large number of individual, hexagonal delay elements 510, 511, 520, 521, 530, 531 over their illuminated cross section, with each of the delay devices being arranged directly adjacent to one another, essentially filling the surface. The delay elements 511, 521, 531 or 510, 520, 530 which are arranged one behind the other in the light propagation direction each have different orientations of the (symbolized by double-headed arrows) optical axes of the birefringent material and, overall, form a large number of optical channels, each of which has a defined, polarization-changing effect. A first delay element 510, 511 with the effect of a $\lambda/4$ delay, a second delay element 520, 521 with the effect of a $\lambda/2$ delay, and a third delay element 530, 531 with the effect of a $\lambda/4$ delay are arranged in this sequence in each optical channel. A combination such as this of two $\lambda/4$ retarders and one $\lambda/2$ retarder in the sequence $\lambda/4$-$\lambda/2$-$\lambda/4$, as already explained in conjunction with FIG. 8, can be achieved from input radiation with any desired polarization state for any desired output polarization state, possibly even a completely polarized output polarization state. In order to achieve sufficiently fine position resolution, raster arrangements and/or segment or facet arrangements with more than four, more than 10, or more than 50 individual delay elements are in each case provided in preferred embodiments, and their crystallographic axes can be rotated as desired with respect to one another. Possible ways for structural configuration of the individual delay devices, which are in the form of plates, can be found, for example, in EP 0 764 858, whose disclosed content relating to this is included in the content of this description. The individual delay elements may also be formed by coated substrates and/or substrates with sub-wavelength structures.

Two advantageous possible ways to implement such delay groups will be explained with reference to FIG. 10. One possibility (FIG. 10(*a*)) is to use a separate, transparent substrate 601, 602, 603, for example in the form of a plane-parallel plate, for each raster delay device, to wring the individual delay elements 610, 611, 612 onto one face of the substrate such that they fill the surface, or to fix them in an optically neutral manner in some other way. Polarization elements 650 as shown in FIG. 10(*b*) are also possible, in which three delay elements 651, 652, 653 with the same shape but with a different orientation of their crystallographic axes are wrung directly onto one other for each optical channel, and this sandwich arrangement is wrung onto a transparent substrate 660.

One embodiment of a polarization element 700 will be described with reference to FIG. 11 which, inter alia, allows a linear polarization state of incident light to be converted to any desired elliptical polarization state of the output light, or vice versa. In this rastered polarization element, a large number of individual birefringent delay elements 702 which may, for example, have a hexagonal shape are arranged on a plane-parallel transparent substrate 701, filling the surface. The adjacent delay elements 702, 703, which each define an individual optical channel, may in this case differ both in terms of the absolute magnitude of the delay that is achieved and in terms of the orientation of their crystallographic axes. For incident, linear-polarized light, the orientation of the ellipse of the elliptically polarized output radiation in each channel is in this case determined by the orientation of the retarder axis, and the extent of the ellipticity is determined by the absolute magnitude or the intensity of the delay. The extent of the delay, that is to say the optical path length difference that is produced, may in this case be described by the parameter $\lambda/x$, where x is preferably >1, and in particular $\geq 2$.

Figure 11:
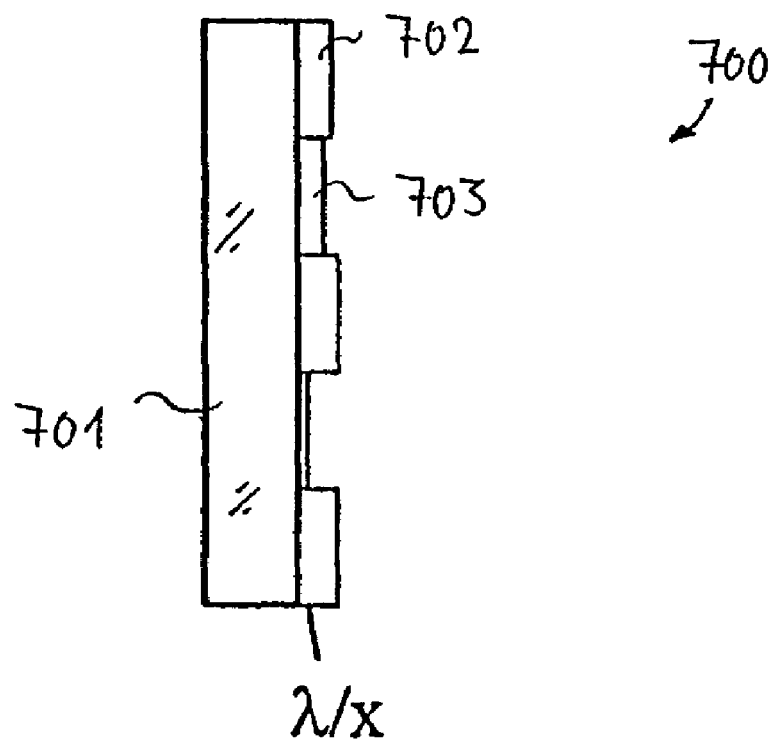
FIG. 11 shows an embodiment of a polarization element ($\lambda/x$ retarder) for changing from linear-polarized light to any desired elliptically polarized light, or vice versa.

FIG. 11 shows the $\lambda/x$ retarder with separately produced delay elements 702, 703 of different thickness, which are wrung onto a substrate. Alternatively, it is also possible to produce the "cells", which have delays of different strength, from an integral initial material by material removal, for example by etching. It is also possible to use diffractive structures analogously to FIG. 6(*a*).

Figure 10:
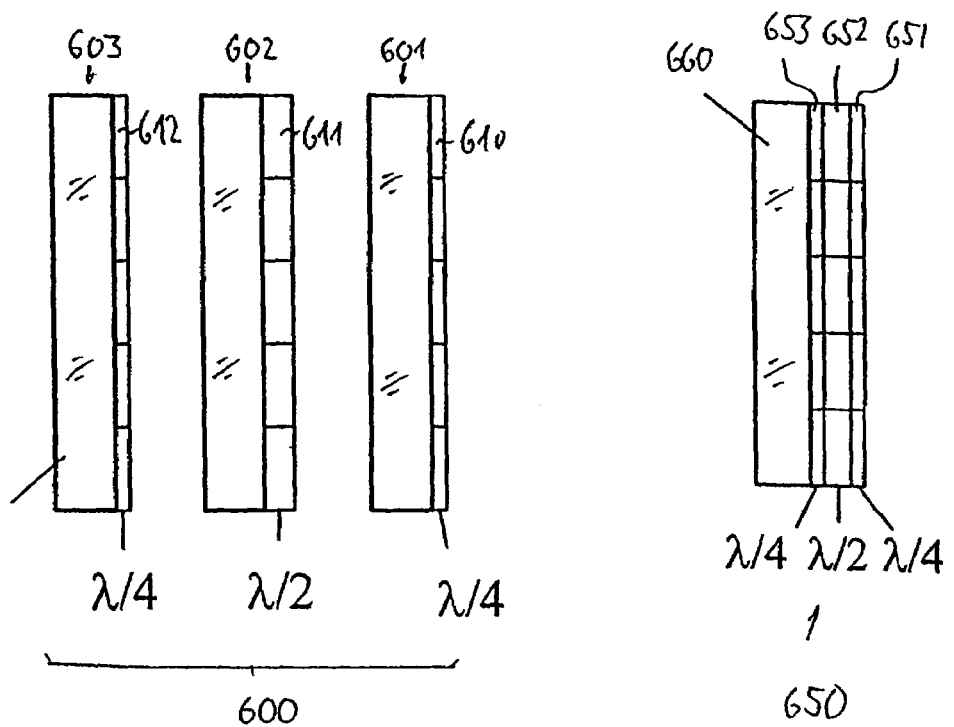
FIG. 10 shows various embodiments for polarization elements of the type shown in FIG. 9.

Polarization-changing optical components of the type illustrated in FIGS. 9-11, may, for example, be used in the illumination system of a projection exposure system in order either to anticipate or to retrospectively compensate for an undesirable change in the polarization state of the light from a light source caused by system components. In particular, it is possible to correct the depolarizing effect of a light mixing rod 10 in systems with linear-polarized light sources. For example, a position-resolving retarder of the type illustrated in FIG. 9 or 10 can be used in the area of a pupil plane between the light source 8 and the rod inlet 11 in order to convert a linear input polarization to an elliptical output polarization such that a linear polarization state once again results on the pupil plane 15 of the illumination system. In the case of retrospective correction for the depolarizing effect of components of the illumination system, a position-resolving polarization element such as this could also be used in the area of the pupil plane 15 in order to convert an elliptical polarization state in the area of this pupil plane to a linear polarization state at the output of the illumination system, once again.

Figure 12:
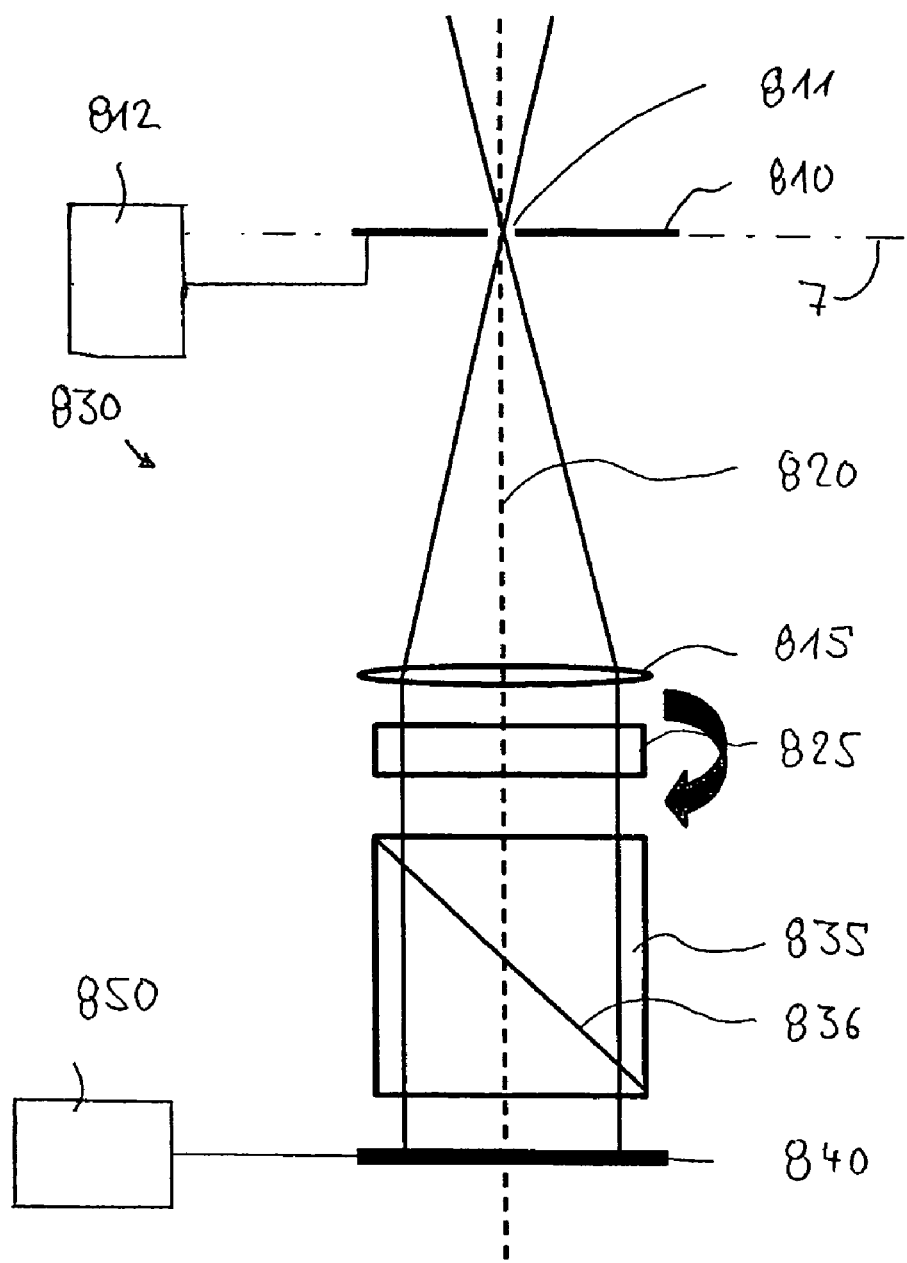
FIG. 12 shows an embodiment of a polarization measuring device.

A preferred embodiment of a polarization measurement device 830 for qualifying the output polarization state of the projection exposure system is shown in FIG. 12. The polarization measurement device 830 allows to measure the polarization state in the exit pupil 16 of the projection objective with an angular resolution of 1 mrad for all field points in the image plane 7 of the projection objective. The polarization measurement device 830 includes an opaque mask 810 having a pinhole 811 which has a size (diameter) substantially larger than the wavelength of the exposure light. The diameter may be in the range between 100 µm and 300 µm, for example. The mask is placed in the image plane 7. The mask 810 is placed in the front focal plane of a positive lens or lens group 815. A spatially resolving detector including a two-dimensional CCD-array 840 is placed in the rear focal plane of the lens 815. A rotatable retarder element 825 taking the form of a $\lambda/4$-plate and rotatable about the optical axis 820 of the measurement device 830 and a polarization beam splitter 835 having a planar beam splitter surface 836 inclined to the optical axis 820 are positioned in that sequence between the lens 815 and the detector 840. The detector 840 is connected to an analyzing unit 850 for evaluating the signals of the detector 840. The measurement device 830 can be moved in mutually perpendicular directions perpendicular to the optical axis of the projection objective by a drive system 812 to selected field points of the image plane.

For performing a complete angle-resolving evaluation of the exit pupil of the projection system for a particular field point in the image plane 7 the polarization measurement device 830 is moved laterally such that the pinhole 811 is placed at the particular field point. The angular distribution of light transiting the pinhole is transformed by the lens 815 to a two-dimensional local (spatial) distribution on the surface of the detector 840 in this 2f-system. Furthermore, the lens 815 serves to create a collimated beam transiting the retardation plate 825 and the beam splitter 835 thus reducing the angular load of these optical components which improves their function.

In a measurement cycle for one field point the λ/4-plate is rotated in predefined angular increments about the optical axis 820 and the intensity of light impinging on the detector 840 is detected with spatial resolution. After completion of at least ½ rotation (180°) a function describing the dependency of the intensity on the angular position of the λ/4-plate is obtained for each position on the surface of the detector, thereby creating a function I(ωt) for each detector location, where I is the intensity, ω is the angular speed and t is the time. Preferably the λ/4-plate is rotated about 360° in one measurement cycle. A Fourier analysis is performed for each function I(ωt) to obtain respective Fourier coefficients. The Fourier coefficients are then analyzed to obtain desired physical quantities such as the components $E_{0x}$ and $E_{0y}$ of the electric field strength in x- and y-direction perpendicular to the optical axis 820, a face shift φ between that components, a preferred direction α of an ellipse describing the polarization state, a length ratio η for the ratio between the long and short axis of the ellipse, the polarization degree P of the radiation and the linear degree of polarization, $P_{LIN}$, of the radiation. Therefore, by means of the polarization measuring device it is possible to characterize the complete polarization state of the radiation for a field point in the image plane 7, thereby allowing, for example, to distinguish between circular polarization and unpolarized light.

By scanning the image plane in x- and y-direction and obtaining these data for selected field points it is possible to provide the position-resolved and angle-resolved measurement of the exit pupil of the projection objective.

The polarization measurement system is useful independent of other features of the invention to characterize any type of optical system. For example, the mask having the pinhole may be placed in the exit plane of an illumination system to characterize directly the polarization state of an illumination beam.

In the embodiment described in connection with FIGS. 13 and 14 the polarization state at the output of the illumination system is optimized in a particularly beneficial way such that a variation of the polarization state across the illuminated field on the reticle is minimized such that little or no gradient of the polarization properties of the radiation impinging on the reticle exists. Particular efforts are made to keep the linear degree of polarization, $P_{LIN}$, virtually constant or at least with a minimum variation the field plane where the reticle is to be placed. Particularly, in a scanner system, the scan-integrated linear degree of polarization along the cross scan direction (direction perpendicular to the scanning direction) shall be made virtually constant. Here, the linear degree of polarization, $P_{LIN}$, is defined as:

$$P_{LIN} = (S_1^2 + S_2^2)^{1/2}/S_0,$$

where $S_0$, $S_1$, $S_2$, and $S_3$ are the Stokes parameter (see e.g. textbook E. Hecht, Optik, second edition, section 8.12.1). For the purpose of this application, a linear degree of polarization is "virtually constant" across a field plane if the absolute value of a difference of the linear degree of polarization between two respective field points in the field plane does not exceed 10%. If this condition is fulfilled, it is possible to get a sufficiently uniform contrast across the entire reticle field when the reticle is imaged onto the image plane of the projection objective.

In order to achieve that goal a position-variant polarization element designed to effect a position-dependent modification of the polarization state over the cross-section of the radiation beam is inserted optically near the exit surface of the illumination system near to the position (where the reticle is to be placed) or in an area optically conjugated to the reticle plane, such as a field plane within the illumination system. Any type of position-variant polarization elements described above can be used for this purpose, for example embodiments such as shown in FIG. 6 or 11.

Figure 13:
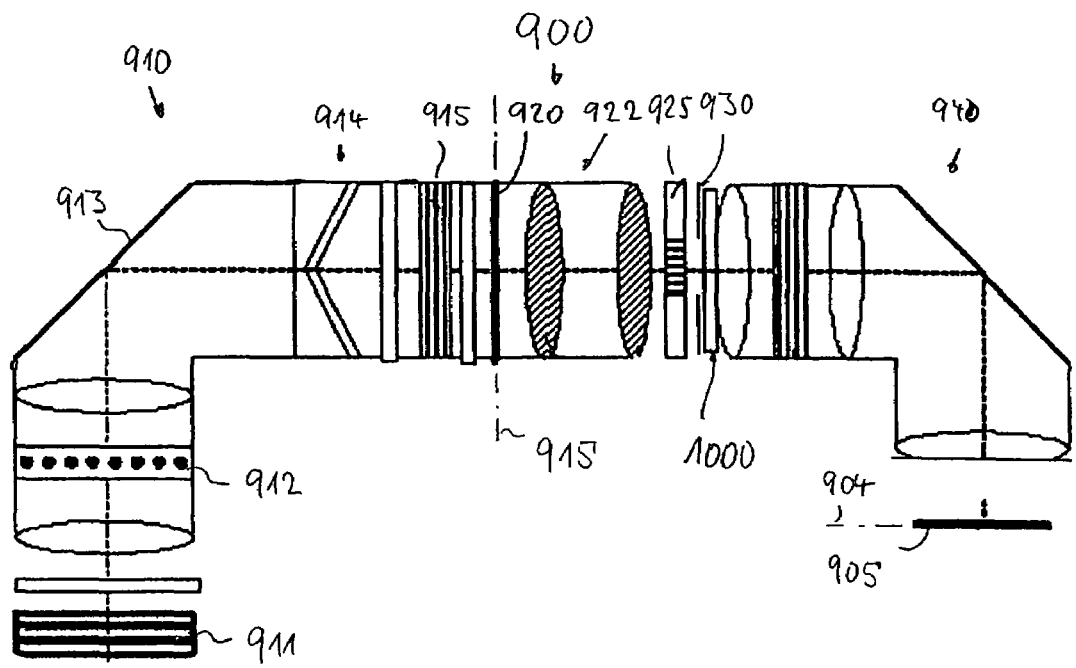
FIG. 13 shows an embodiment of an illumination system allowing to adjust a constant linear degree of polarization across the illumination field on a reticle.

FIG. 13 shows an illumination system 900 designed to illuminate a reticle 905 placed in a reticle plane 904 (object plane of the subsequent projection objective) with radiation having a minimum variation of the linear degree of polarization across the reticle field. Linearly polarized laser radiation coming from a primary laser source (not shown) is received by a light distribution device 910 which transforms the laser beam into a two-dimensional intensity distribution in a pupil forming plane 915 of the illumination system, which is optically conjugate to a pupil plane of the projection objective. The light distribution device includes, in that sequence, an exchanger device 911 for diffractive optical elements (DOE), a pupil correcting device 912, a folding mirror 913, an axicon system 914, and an exchanging device 915 containing various retardation elements for rotating the polarization of the radiation in a position-resolving manner. The diffractive optical element is a raster element having a two-dimensional array structure. The diffractive structure on a diffractive optical element defines the angular characteristics of radiation exiting the diffractive optical element. Generally, a small amount of etendu is introduced by a diffractive optical element with typical ray angles between +3° and −3° with respect to the optical axis. The diffractive structures are designed such that general features of the intensity distribution in the pupil forming plane are obtained, e.g. a dipole illumination or quadrupole illumination. The pupil correcting device 912 is designed to compensate for inhomogenies of the intensity distribution in the pupil-forming plane. The axicon system 914 is also used to define the intensity distribution in the pupil-forming plane 915. The axicon system includes two conical lenses having conical surfaces facing each other, where an axial distance between the conical surfaces can be adjusted such that radiation can be selected between on-axis conventional illumination (axial distance 0) and off-axis distributions such as annular illumination.

The exchanging device 915 for different retardation elements contributes to adjusting the polarization properties of the illumination beam in the pupil forming plane 915. The exchanging device may include various retardation elements allowing to define the polarization state without light loss in a position-resolving manner. Suitable rotating elements are e.g.

disclosed in the patent U.S. Pat. No. 6,392,800 B2 or US patent application US 2002/0176166 A1 filed by the applicant. The disclosure of these documents is incorporated herein by reference.

Immediately downstream of the polarization rotating elements in the exchanger 915 a field-defining-element 920 is arranged. The field-defining-element is another optical element for introducing etendu into the radiation beam, i.e. for modifying the angular spectrum of the illumination. At each position of the field-defining-element radiation from the beam impinging on the field-defining-element is diffracted or refracted depending on the local diffractive and/or refractive properties of the field-defining-element. One embodiment of a field-defining-element is a two-dimensional array of refractive micro lenses forming a refractive optical element (ROE). The field-defining-element may also include a two-dimensional array of diffractive optical element (DOE) with locally varying diffraction properties. Combinations of refractive optical elements and diffractive optical elements are also possible. The field-defining-element is positioned in the pupil forming plane 915 or very close to this pupil forming plane, that is in the vicinity of the pupil forming plane. The field-defining-element may be designed to introduce different angular distributions of exiting light in different directions perpendicular to the optical axis, i.e. by creating radiation having different numerical apertures in x- and y-direction, thereby defining the shape of an illumination field in an intermediate field plane 930 downstream of the pupil forming plane 915. The illumination field may be rectangular with a high aspect ratio suitable for scanning operation of the exposure system. The angular distribution of radiation in the field forming plane 915 is transformed into a spatial distribution of illumination in the illumination field position at the intermediate field plane 930 by an optical system 922. An imaging system 940 downstream of the intermediate field plane 930 and having a magnification ratio close to 1 serves to image the illumination field of the intermediate field plane 930 onto the reticle 905 placed in the reticle plane 904.

The field defining element 920 is designed to create an angular distribution of light which is highly uniform. If a further improvement of uniformity is desired a light mixing element, such that a transparent integrator rod mixing the light by internal reflection may be positioned between the optical system 922 and the intermediate field plane 930. Further, in order to allow compensation of inhomogeneties in the radiation exiting the field defining elements a field correcting device 925 may be positioned immediately upstream of the intermediate field plane 930. The field-correcting device is designed for correcting the intensity collected during scanning (scan-integrated intensity) in a scanning system by varying the local width of the illumination field at the reticle plane along the y-direction corresponding the scanning direction. A linear field extending in the x-direction of movable masks movable selectively in the y-direction (scan-direction) may be used for this purpose to adjust the width of the rectangular illumination field as a function of the length dimension. Suitable embodiments for field-correcting devices are disclosed in European patent application EP 1 020 769 A2, the disclosure of this document being incorporated into this application by reference.

In order to adjust the linear degree of polarization, $P_{LIN}$ to values constant or almost constant across the entire illumination field at the reticle at least for the scan-integrated field curve a polarization compensation element (polarization compensator) 1000 is placed in the immediate vicinity of the intermediate field plane 930, which in turn as optically conjugated to the reticle plane 904. An embodiment is shown in FIG. 14. The compensation element 1000 is an example for a position-resolving retarder having a two-dimensional array of retardation elements 1001 placed next to each other across the entire illuminated cross section of the light beam. Each retarder element 1001 is made of birefringent material, where the orientation of the crystallographic axes (arrows) and the axial thickness of the single elements is designed such that the desired retardation as function of location of the beam cross section is adjusted such that the linear degree of polarization is essentially constant after the beam has passed through the compensation element 1000. Another suitable element is shown FIG. 11. Other types of polarization compensators suitable for adjusting the linear degree of polarization in a field plane downstream of the compensator element are disclosed in patent U.S. Pat. No. 6,252,712 B1, the disclosure of which is incorporated herein by reference.

Figure 14:
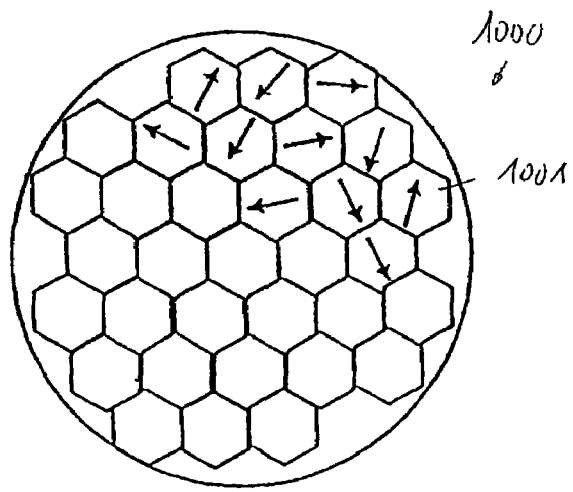
FIG. 14 shows a polarization compensation element for use in the illumination system of FIG. 13.

In another embodiment an exchanging device is provided to allow changing between different types of polarization compensators of the type shown in FIG. 14 in order to vary the compensation characteristics across the beam diameter depending on the properties of the illumination beam defined by the exchangeable and/or adjustable optical elements upstream of the polarization compensator. This allows to use different polarization compensators each individually adapted to particular illumination settings.

All the polarization elements described here with a fixed predetermined, position-resolving and/or angle-resolving, polarization-changing effect may be used as exchangeable polarization elements, which can be inserted into the beam path or can be removed from it, selectively, with the aid of suitable exchanging devices, in order to set the output polarization state of the projection illumination system in a defined manner.

The described polarization elements may all be used in the context of polarization manipulation devices according to the invention. All of the polarization elements and polarization-changing optical components described in this application with an angle-variant and/or position-variant effect may also advantageously be used independently of the capability to exchange them in illumination systems or projection optics for microlithographic projection illumination systems, or in other fields, for example in the field of other projection systems or in the field of microscopy. This also applies to the described polarization elements with a variably adjustable polarization-changing effect, for example for the adjustable delay system described in conjunction with FIGS. 2-4.

The above description of the preferred embodiments has been given by way of example. From the disclosure given, those skilled in the art will not only understand the present invention and it is attendant advantages, but will also find apparent various changes and modifications to these structures and methods disclose. It is sought therefore, to cover all changes and modifications as fall within the spirit and scope of the invention, as defined by the appended claims and equivalents thereof.

What is claimed is:

1. An exposure method for exposing a substrate which is arranged in the area of an image plane of a projection objective of a projection exposure system by at least one image of a pattern of a mask which is arranged in the area of an object plane of the projection objective, comprising:

illuminating the pattern with illumination radiation from an illumination system for production of radiation which is changed by the pattern;

passing the radiation which has been changed by the pattern through the projection objective in order to produce output radiation directed at the substrate and having an output polarization state;

measuring the output polarization state with an aid of at least one polarization measurement device for production of an actual signal which represents the current actual output polarization state;

variably adjusting the output polarization state with the aid of at least one polarization manipulation device as a function of an adjustment signal derived from the actual signal in order to make the output polarization state approach a nominal output polarization state which is intended for the exposure.

2. An exposure method according to claim 1, wherein measuring the output polarization state comprises at least one of an angle-resolved and a position-resolved measurement in the area of a field plane of the projection objective.

3. An exposure method according to claim 1, wherein measuring the output polarization state comprises a position-resolved measurement of the polarization state in the area of a pupil plane of a projection objective.

4. An exposure method according to claim 1, wherein the output polarization state is adjusted during operation of the projection exposure system in situ at a location of use of the projection exposure system.

5. An exposure method according to claim 1, wherein the polarization manipulation device includes at least one polarization element arranged at an installation position located in the vicinity or in a pupil plane of an optical system.

6. An exposure method according to claim 1, wherein the polarization manipulation device includes at least one polarization element arranged at an installation position in the vicinity or in a field plane of an optical system.

7. An exposure method according to claim 1, wherein at least one of the illumination system and the projection objective contains at least one optical element which causes a disturbance to a polarization distribution over the cross section of a radiation beam, and wherein the output polarization state is adjusted such that the disturbance is at least partially compensated for.

8. An exposure method according to claim 1, wherein adjusting the output polarization state comprises optional insertion of at least one polarization element with a predetermined effect function at a predetermined installation position into the beam path between a light source, which is associated with the illumination system, and the image plane of the projection objective.

9. An exposure method according to claim 1, wherein adjusting of the output polarization state comprises exchanging a first polarization element having a first effect function by at least one second polarization element having a second effect function differing from the first effect function.

10. An exposure method according to claim 1, wherein adjusting the output polarization state comprises step-by-step or continuous variation of the effect function of at least one adjustable polarization element which is arranged in the beam path.

11. An exposure method according to claim 10, wherein the variation of the effect function comprises position-resolving adjustment of locally different retardation effects on a retardation device.

12. An exposure method according to claim 1, further comprising:

producing at least one adjustment signal for at least one polarization manipulation device on the basis of a preset function; and adjusting the output polarization state as a function of the adjustment signal.

13. An exposure method according to claim 1, wherein polarization states of the projection exposure system are influenced essentially independently of one another over a field and over a pupil.

14. An exposure method according to claim 1, wherein a polarization state at the output of the illumination system is optimized such that a variation of the polarization state across the illuminated field on the mask is minimized.

15. An exposure method according to claim 14, wherein the polarization state at the output of the illumination system is optimized such that an absolute value of a difference of the linear degree of polarization, PLIN, between two respective field points in a field plane where the mask is to be placed does not exceed 10%.

16. A projection exposure system for exposing a substrate which is arranged in the area of the image plane of a projection objective with at least one image of a pattern of a mask which is arranged in the area of an object plane of the projection objective comprising:

an illumination system for illuminating the pattern with illumination radiation;

a projection objective for producing an image of the pattern in the area of the image plane with the aid of output radiation which is directed at the substrate and has an output polarization state;

at least one polarization manipulation device for variable adjustment of the output polarization state;

at least one polarization measurement device for measurement of the output polarization state; and a control device for controlling the at least one polarization manipulation device as a function of measurement signals from the polarization measurement device.

17. A projection exposure system according to claim 16, wherein a control loop is provided for real-time control of the output polarization state, the control-loop comprising:

the at least one polarization measurement device;

a control unit which is connected to the polarization measurement device; and at least one polarization manipulation device which is connected to the control unit.

18. A projection exposure system according to claim 16, wherein the polarization measurement device is designed for at least one of position-resolving and angle-resolving measurement of the polarization state in the area of the image plane of the projection objective.

19. A projection exposure system according to claim 16, wherein the polarization measurement device is designed for position-resolving measurement of the polarization state in the area of a pupil plane of the projection objective.

20. A projection exposure system according to claim 16, wherein the polarization measurement device comprises:

a mask having a transparent pinhole;

a lens or lens group having positive refractive power;

and a spatially resolving detector having a detector surface;

wherein an angular distribution of radiation transiting the pinhole is transformed by the lens or lens group into a spatial distribution of radiation on the detector surface.

21. A projection exposure system according to claim 20, wherein between the mask having the pinhole and the detector surface there is provided a rotatable retardation element and a polarization beam splitter.

22. A projection exposure system according to claim 21, wherein there is provided a drive systems for moving the polarization measurement system in directions perpendicular to an optical axis of the projection objective for positioning the pinhole at different field points of the image plane of the projection objective.

23. A projection exposure system according to claim 16, wherein at least one polarization manipulation device is arranged in a vicinity of a field plane or in a field plane of the projection exposure system.

24. A projection exposure system according to claim 16, wherein at least one polarization manipulation device is arranged in a vicinity or in a pupil plane of the projection exposure system.

25. A projection exposure system according to claim 16, wherein at least one of the illumination system and the projection objective contains at least one optical element which produces a disturbance in a polarization distribution over the cross section of a beam, and wherein the polarization manipulation device is configured as a compensator for at least partial compensation for the disturbance.

26. A projection exposure system according to claim 16, wherein at least one polarization manipulation device is in the form of an exchanging device, by means of which one or more polarization elements can optionally be inserted into or removed from an illumination beam path or from an imaging beam path.

27. A projection exposure system according to claim 16, wherein at least one polarization manipulation device is in the form of an exchanging device, which is associated with at least two polarization elements with a different effect function, with the exchanging device being an exchanging device for exchanging polarization elements with a different function.

28. A projection exposure system according to claim 16, wherein at least one polarization manipulation device is in the form of a device for step-by-step or continuous variation of the effect function of an adjustable polarization element which is arranged in the beam path of the illumination system.

29. A projection exposure system according to claim 28, wherein the adjustable polarization element has an associated retardation device with at least one retardation element composed of stress-birefringent material, which has associated actuators for variable adjustment of a predetermined stress state, in accordance with a predetermined position distribution.

30. A projection exposure system according to claim 29, wherein the retardation device is configured to be adjustable in a variable manner such that a position-resolving change to the effect function of the polarization element can be carried out by variation of a position distribution of the retardation effect over the cross section of the retardation device.

31. A projection exposure system according to claim 16, wherein at least one polarization manipulation device comprises at least one retardation device which is moveably mounted.

32. A projection exposure system according to claim 31, wherein at least one polarization manipulation device contains at least one retardation device which is rotatably mounted.

33. A projection exposure system according to claim 16, wherein at least one polarization manipulation device contains at least one polarization element which is configured to be at least one of decentered transversely with respect to an optical axis and tilted.

34. A projection exposure system according to claim 16, wherein at least one polarization manipulation device contains a polarization element which comprises a substrate to which at least one isotropic or anisotropic coating, which is composed of birefringent material, is applied.

35. A projection exposure system according to claim 34, wherein the polarization element has associated devices for mechanical deformation of the polarization element which contains the coating.

36. A projection exposure system according to claim 35, wherein the coating is a form birefringent multiple layer system having a plurality of individual layers, with at least two of the individual layers having an optical layer thickness which is small in comparison to the operating wavelength of the illumination radiation.

37. A projection exposure system according to claim 16, wherein at least one polarization manipulation device comprises at least one diffractive polarization element with at least one birefringent sub-wavelength structure for producing structure-induced birefringence.

38. A projection exposure system according to claim 37, wherein at least one polarization manipulation device contains at least one polarization element, and wherein various areas with different sub-wavelength structures are arranged alongside one another, for production of a position-variant effect function for the polarization element.

39. A projection exposure system according to claim 16, wherein at least one polarization manipulation device comprises at least one retardation group having at least one first retardation device with a first retardation effect, and having at least one second retardation device with a second retardation effect that differs from the first retardation effect.

40. A projection exposure system according to claim 39, wherein at least one retardation device in the retardation group has the same retardation effect over its entire useful cross section.

41. A projection exposure system according to claim 39, wherein at least one retardation device in the retardation group comprises a plurality of individual retardation elements which are distributed over the cross section of the retardation device and are arranged in a raster arrangement, essentially filling the surface area.

42. A projection exposure system according to claim 39, wherein the retardation elements in a raster arrangement differ in terms of at least one of an absolute magnitude ($\lambda/x$) of the retardation effect and in terms of the orientation of the crystallographic axis.

43. A projection exposure system according to claim 39, wherein the retardation group comprises, in this sequence, a first retardation device with the effect of a $\lambda/4$ retardation, a second retardation device with the effect of a $\lambda/2$ retardation, and a third retardation device with the effect of a $\lambda/4$ retardation.

44. A projection exposure system according to claim 16, wherein at least one polarization manipulation device comprises at least one polarization element, and wherein different individual retardation elements which have a different retardation effect ($\lambda/x$) are arranged alongside one another.

* * * * *